US008484538B2

(12) United States Patent
Suzuki et al.

(10) Patent No.: US 8,484,538 B2
(45) Date of Patent: *Jul. 9, 2013

(54) FEC (FORWARD ERROR CORRECTION) DECODER WITH DYNAMIC PARAMETERS

(75) Inventors: Hiroshi Suzuki, Irvine, CA (US); Alan Y. Kwentus, Coto de Caza, CA (US); Stephen Edward Krafft, Los Angeles, CA (US); Kevin M. Eddy, Aliso Viejo, CA (US); Steven T. Jaffe, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1745 days.

This patent is subject to a terminal disclaimer.

(21) Appl. No.: 11/823,225

(22) Filed: Jun. 27, 2007

(65) Prior Publication Data

US 2007/0256001 A1 Nov. 1, 2007

Related U.S. Application Data

(63) Continuation of application No. 10/916,919, filed on Aug. 12, 2004, now Pat. No. 7,257,764.

(60) Provisional application No. 60/516,826, filed on Nov. 3, 2003.

(51) Int. Cl.
*H03M 13/35* (2006.01)
(52) U.S. Cl.
USPC ............................ 714/774; 714/775; 714/776
(58) Field of Classification Search
USPC .......................................... 714/774, 775, 776
See application file for complete search history.

(56) References Cited

U.S. PATENT DOCUMENTS

| 5,583,562 | A | * | 12/1996 | Birch et al. | 725/151 |
|---|---|---|---|---|---|
| 5,699,369 | A | * | 12/1997 | Guha | 714/774 |
| 5,721,742 | A | * | 2/1998 | Okajima et al. | 714/751 |
| 5,809,427 | A | * | 9/1998 | Perreault et al. | 455/513 |
| 5,839,077 | A | * | 11/1998 | Kowaguchi | 455/517 |
| 5,963,548 | A | * | 10/1999 | Virtanen | 370/335 |
| 6,285,681 | B1 | * | 9/2001 | Kolze et al. | 370/442 |
| 6,421,387 | B1 | * | 7/2002 | Rhee | 375/240.27 |
| 6,459,687 | B1 | * | 10/2002 | Bourlas et al. | 370/328 |
| 6,477,669 | B1 | * | 11/2002 | Agarwal et al. | 714/708 |
| 6,574,211 | B2 | * | 6/2003 | Padovani et al. | 370/347 |
| 6,611,795 | B2 | * | 8/2003 | Cooper | 702/191 |
| 6,625,776 | B1 | * | 9/2003 | Wright et al. | 714/774 |
| 6,625,777 | B1 | * | 9/2003 | Levin et al. | 714/774 |
| 6,865,188 | B1 | * | 3/2005 | Stirling et al. | 370/460 |
| 6,891,858 | B1 | * | 5/2005 | Mahesh et al. | 370/480 |

(Continued)

*Primary Examiner* — Stephen M Baker
(74) *Attorney, Agent, or Firm* — Garlick & Markison; Shayne X. Short

(57) ABSTRACT

FEC (Forward Error Correction) decoder with dynamic parameters. A novel means by which FEC parameters may be encoded into, and subsequently extracted from, a signal stream to allow for adaptive changing of any 1 or more operational parameters that govern communications across a communication channel. FEC parameters are encoded directly into a data frame such that the data frame is treated identical to all other data frames within the signal stream. When the data frame actually includes FEC parameters, it is characterized as a CP (Control Packet) type. For example, when decoding an MPEG stream, an MPEG block that includes FEC parameters, that MPEG block is characterized as a CP MPEG block. The means by which FEC parameters are encoded and extracted from the signal stream allows for much easier adaptive modification of the manner by which signal are encoded, modulated, and processed within a communication system.

20 Claims, 26 Drawing Sheets frame structure that consists of FEC blocks with dynamic parameters

U.S. PATENT DOCUMENTS

| | | | |
|---|---|---|---|
| 6,909,753 B2 * | 6/2005 | Meehan et al. | 375/240.27 |
| 6,957,380 B2 * | 10/2005 | Lee et al. | 714/774 |
| 6,965,636 B1 * | 11/2005 | DesJardins et al. | 375/219 |
| 6,987,754 B2 * | 1/2006 | Shahar et al. | 370/349 |
| 7,023,871 B2 * | 4/2006 | Lind et al. | 370/437 |
| 7,032,159 B2 * | 4/2006 | Lusky et al. | 714/774 |
| 7,050,419 B2 * | 5/2006 | Azenkot et al. | 370/347 |
| 7,165,204 B2 * | 1/2007 | Cudak et al. | 714/751 |
| 7,165,207 B2 * | 1/2007 | Olivieri et al. | 714/774 |
| 7,428,669 B2 * | 9/2008 | Cioffi | 714/704 |

* cited by examiner

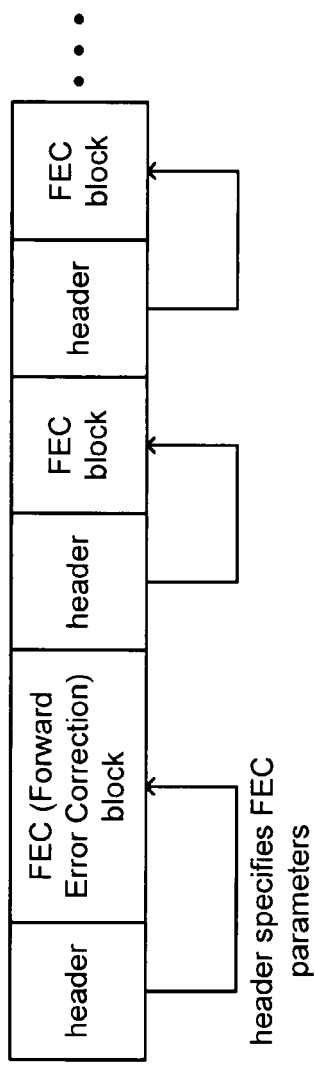
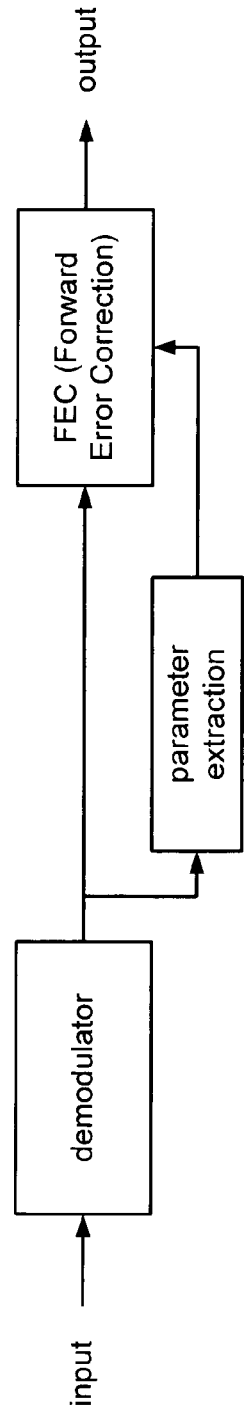
receiver architecture and frame structure
(prior art)
Fig. 1A
receiver architecture
(prior art)
Fig. 1B

HDTV (High Definition Television) communication system satellite receiver STB (Set Top Box) system SG (Satellite Gateway) employing adaptive modulation and encoding AMFC (Adaptive Modulation Formatter & Controller)

communication system

FEC (Foward Error Correction) decoding chain functionality parameters to govern 1 or more of the various functional blocks within FEC decoding chain (output of CP processor)

frame structure that consists of FEC blocks with dynamic parameters

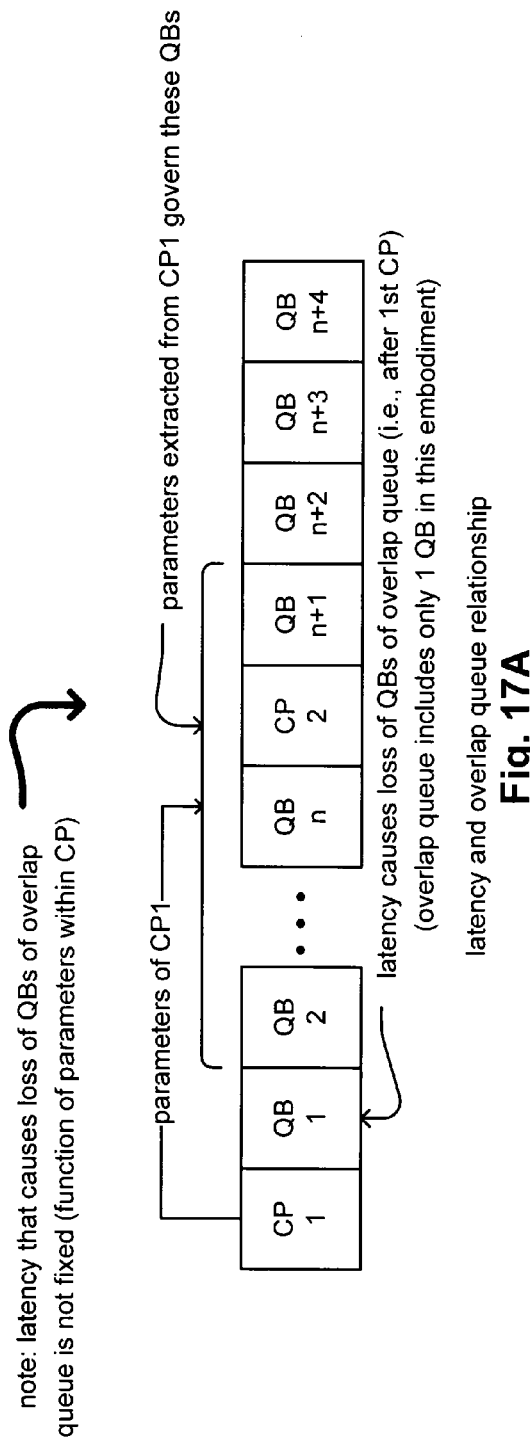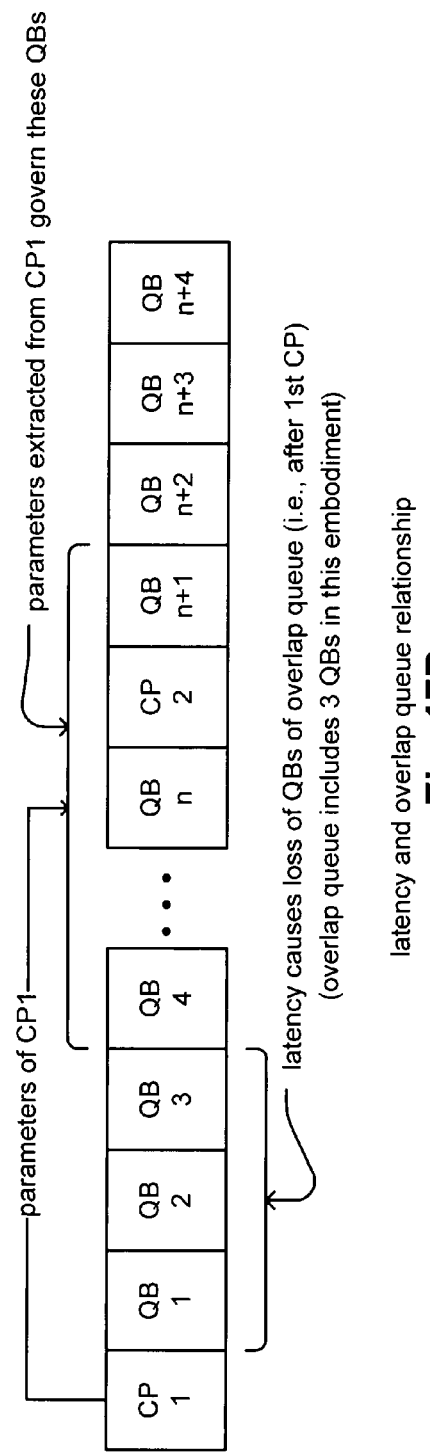

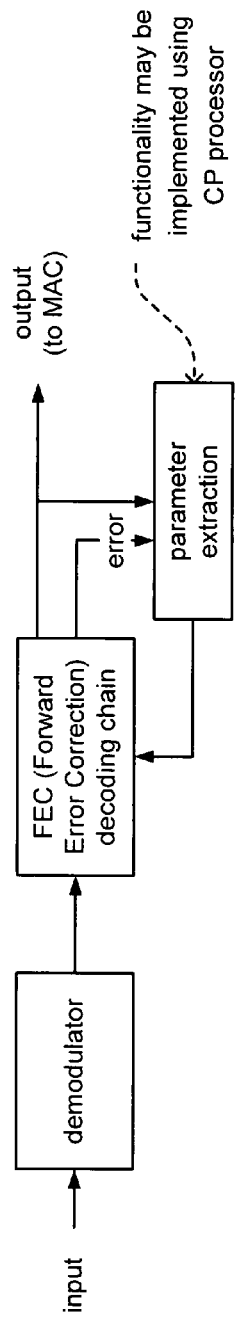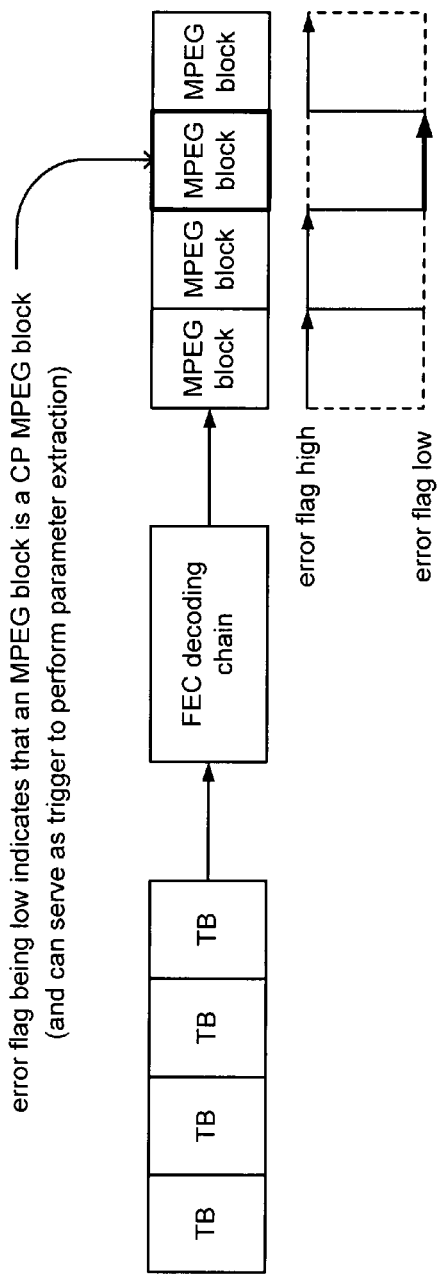

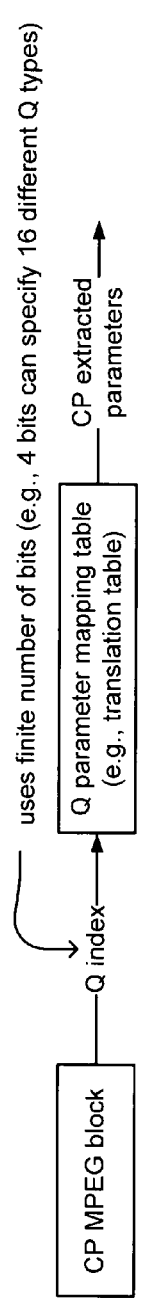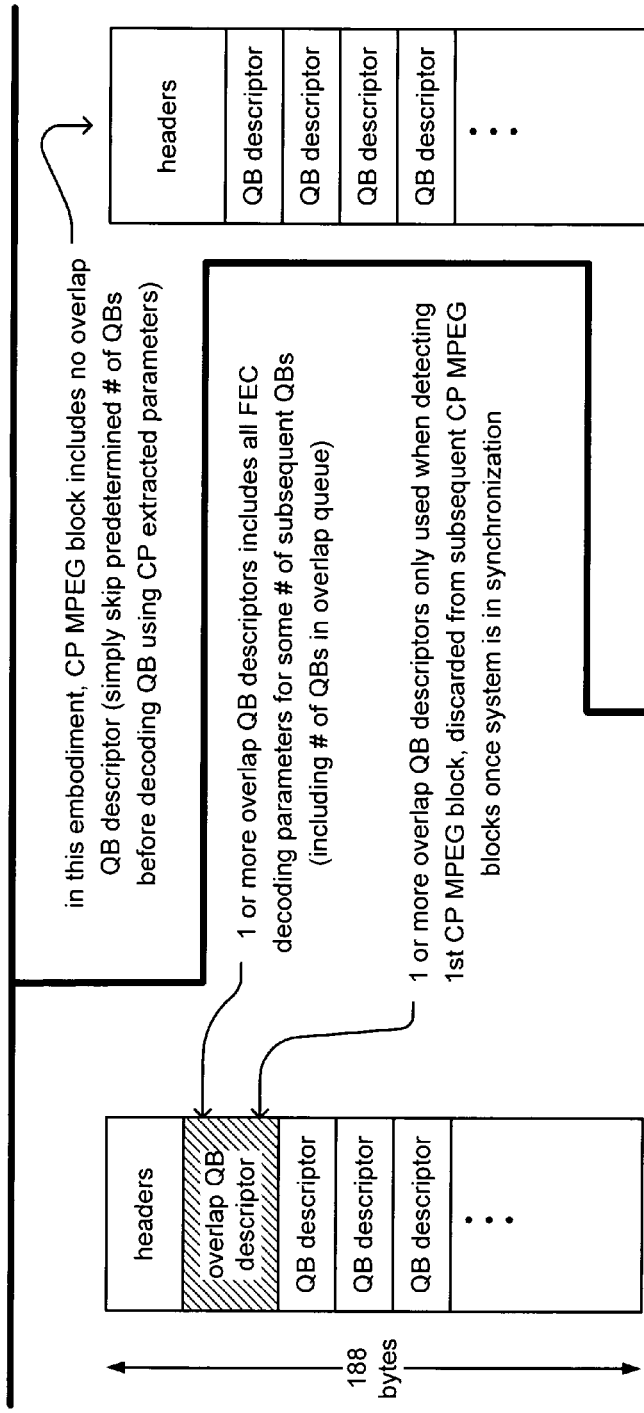
Fig. 19A
Fig. 19B
Fig. 19C

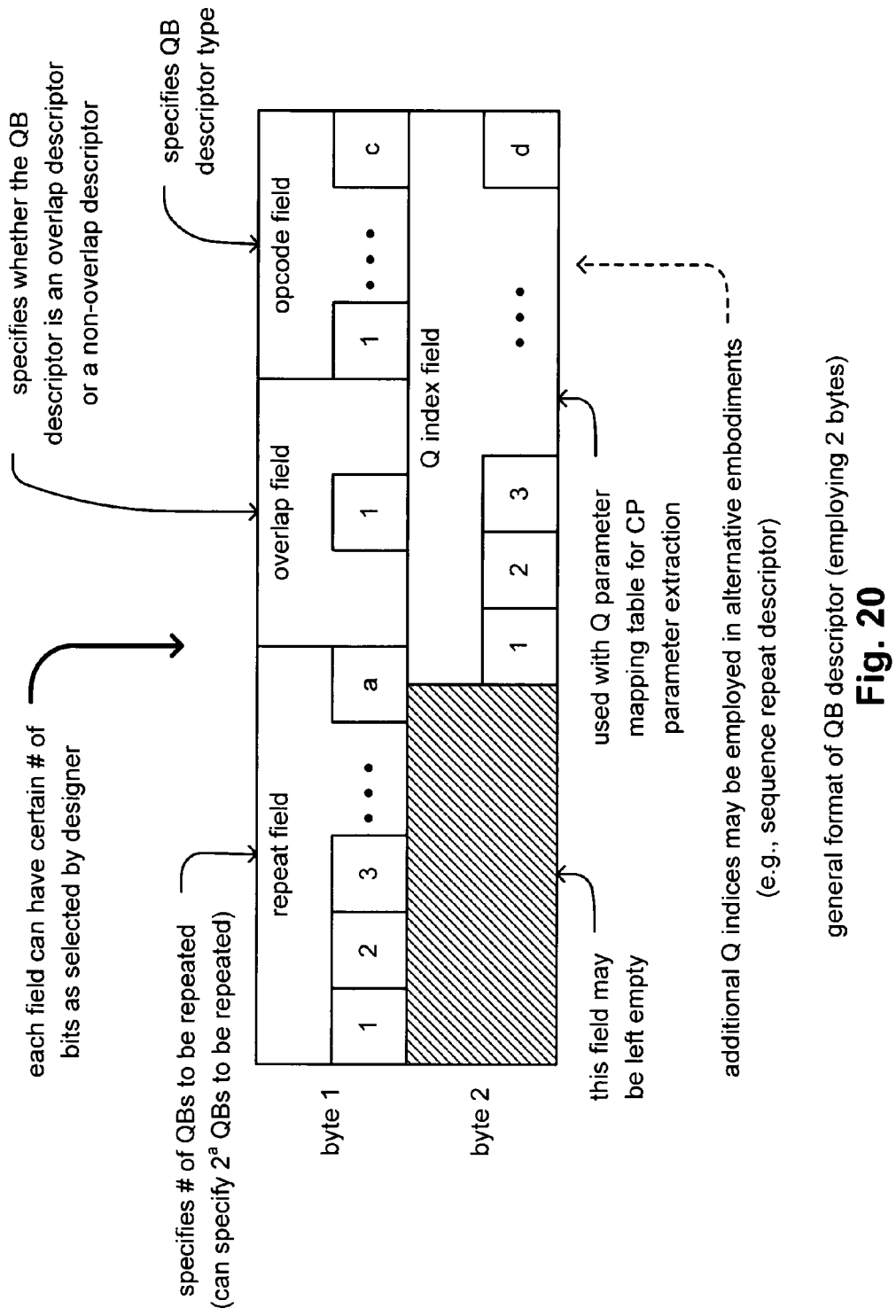

format of QB repeat descriptor (employing 2 bytes) having 1 Q index format of QB sequence repeat descriptor (employing multiple bytes) having multiple Q indices CP (Control Packet) processor functionality method for FEC (Forward Error Correction) decoding of a frame structure supporting dynamic FEC parameters method for CP (Control Packet) processing

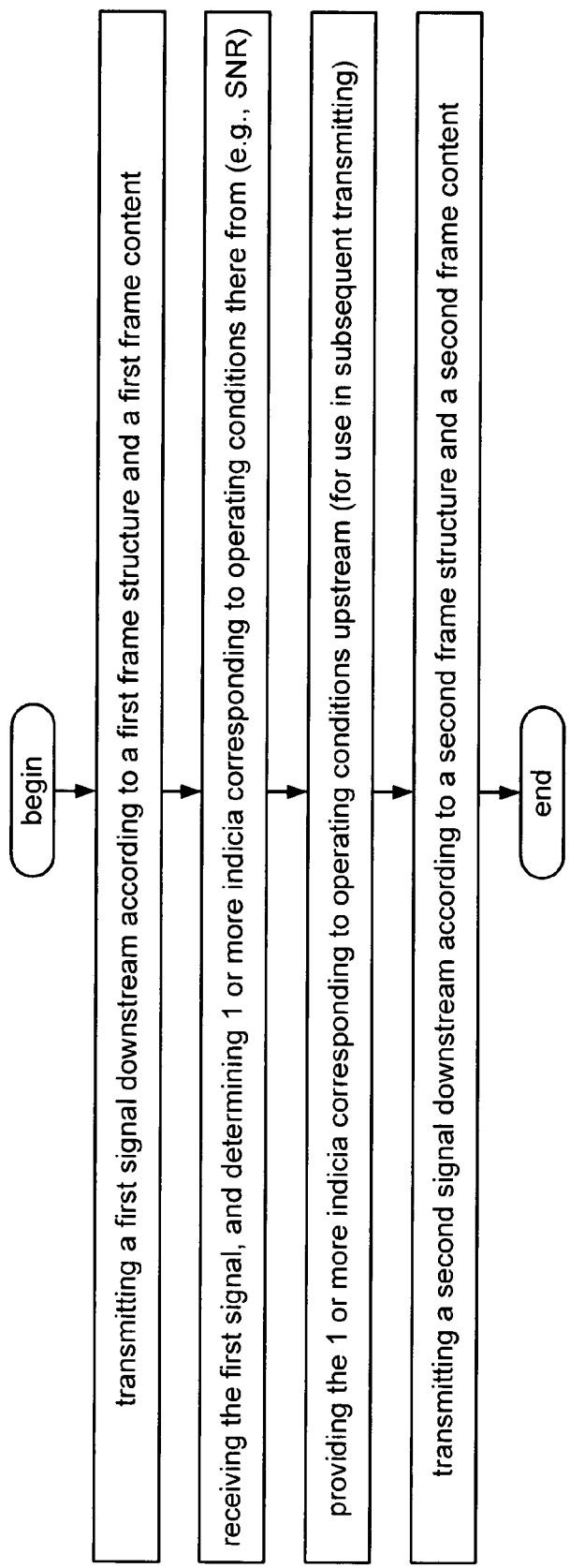

FEC (FORWARD ERROR CORRECTION) DECODER WITH DYNAMIC PARAMETERS

CROSS REFERENCE TO RELATED PATENTS/PATENT APPLICATIONS

Continuation Priority Claim, 35 U.S.C. §120

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility application Ser. No. 10/916,919, entitled "FEC (Forward Error Correction) decoder with dynamic parameters," filed Aug. 12, 2004, pending, which claims priority pursuant to 35 U.S.C. §119(e) to the following U.S. Provisional Patent Application which is hereby incorporated herein by reference in its entirety and made part of the present U.S. Utility Patent Application for all purposes:

a. U.S. Provisional Application Ser. No. 60/516,826, entitled "FEC (Forward Error Correction) decoder with dynamic parameters," filed Nov. 3, 2003.

INCORPORATION BY REFERENCE

The following U.S. Utility Patent Application is hereby incorporated herein by reference in its entirety and made part of the present U.S. Utility Patent Application for all purposes:

1. U.S. Utility patent application Ser. No. 10/319,929, entitled "DOWNSTREAM TIME DOMAIN BASED ADAPTIVE MODULATION FOR DOCSIS BASED APPLICATIONS," filed Dec. 12, 2002, pending.

BACKGROUND OF THE INVENTION

1. Technical Field of the Invention

The invention relates generally to communication systems; and, more particularly, it relates to decoding processing within such communication systems.

2. Description of Related Art

Various communication systems have been under constant development for many years. Within certain types of communication systems, FEC (Forward Error Correction) is employed such that various parameters employed within the receiver end/decoder end of a communication channel are appropriately suited to be able to correct for most (ideally, any) errors that may be introduced within signal transmitted across the communication channel from a transmitter end to a receiver end. Sometimes, it is desirable to adjust certain of the various operational parameters within a receiver end communication device in an effort to compensate for any changes to the operating conditions (or communication device status) thereby providing relatively good performance and error correction.

However, in order to change these operational parameters within an FEC functional block within a receiver end communication device, the parameter configuration should be changed on the fly (i.e., in real time) for adaptive modulation and coding. In order to support this approach to performing FEC decoding, the FEC decoding parameters must be known and programmed to an FEC decoding functional block before input signals get into the FEC block. However, the approaches for doing this within the prior art do not provide for very operation and performance.

One prior art way of adaptively modifying the operational parameters for an FEC block is to send the FEC parameter information in frame headers and to extract the FEC parameters out of them. Once these FEC decoding parameters have been extracted from the frame headers, then those FEC decoding parameters may then be programmed back to the corresponding FEC block. This approach is typically a 1 to 1 approach, in that, a header includes FEC operational parameter information corresponding to an immediately following and subsequent FEC block. This prior art is shown pictorially in the following described prior art figures.

FIG. 1A is a diagram illustrating an embodiment of a prior art frame structure. In this illustration, it can be seen that the frame header immediately preceding an FEC block includes the FEC operational parameters that correspond to the immediately following FEC block. This information immediately extracted from the header is then employed to configure the FEC decoding parameters that are used to perform the FEC decoding of the FEC block immediately following the frame header. This prior art inherently involves an undesirable decoding and operational latency, in that, the header of the FEC block must be processed (to extract the information corresponding to the FEC operational parameters by which the subsequent FEC block is to be decoded), then the FEC block must be configured according to that extracted information, and then the FEC block is then actually decoded. This latency is existent for each and every header and FEC block combination within this prior art approach.

FIG. 1B is a diagram illustrating an embodiment of a prior art receiver architecture that may be employed to effectuate the approach of the corresponding FIG. 1A described above. An input signal is first provided to a demodulator that performs any of the necessary demodulation of the received signal to get it into a format that is appropriate for subsequent FEC decoding. In addition, the output of the demodulator is simultaneously provided to a parameter extraction functional block and to a FEC decoding functional block. The FEC decoding functional block must wait for the extraction of the FEC decoding parameters from the parameter extraction functional block before performing FEC decoding in a manner that is appropriate for the FEC block that immediately follows the frame header from which the FEC decoding parameters have been extracted. Again, it can be seen that this latency with respect to this prior art approach to adjust the FEC operational parameters involves processing the header that includes information corresponding to the FEC operational parameters, configuring the FEC functional block according to the most recently extracted FEC operational parameters, and then performing the actually decoding using the FEC decoding functional block of the corresponding FEC block for which these FEC operational parameters correspond.

Moreover, in this prior art approach, the frame headers are either not protected by any error control code, or they are protected by a different FEC that protects the FEC blocks within the input signal stream. This different FEC that may be employed to protect the frame headers is less powerful than the one for the actual data part of the input signal stream. This type of prior art receiver suffers from many deficiencies. For example, it cannot operate at low SNR (Signal to Noise Ratio) because the frame headers are vulnerable to noise, as they are typically not protected by any error control code. Also, this prior art approach suffers from the inherently slow and serial approach performed by this prior art receiver architecture that includes a parameter extraction functional block that must be employed before performing any FEC decoding of the FEC blocks of the input signal stream that immediately follow the frame header (e.g., the frame header that includes the FEC decoding parameters for that immediately following FEC block). Also in the prior art, the information pertaining to the FEC parameters is embedded in the header before the FEC, and it uses a different coding than the data part of the input signal stream or no coding at all thereby providing little protection.

As such, it is clear that there is a need in the art for a manner by which FEC operational parameters may be modified and adjusted on the fly (i.e., in real time) to effectuate higher performance within error correctional coding communication systems.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 1A is a diagram illustrating an embodiment of a prior art frame structure.

FIG. 1B is a diagram illustrating an embodiment of a prior art receiver architecture that may be employed in accordance with the invention.

FIG. 17A is a diagram illustrating an embodiment of the relationship between latency and overlap queue that may be existent in accordance with certain aspects of the invention.

FIG. 17B is a diagram illustrating another embodiment of the relationship between latency and overlap queue that may be existent in accordance with certain aspects of the invention.

FIG. 18A is a diagram illustrating an embodiment of a receiver architecture employing dynamic parameters supported within a frame structure in accordance with certain aspects of the invention.

FIG. 18B is a diagram illustrating an embodiment of determination of a CP (Control Packet) MPEG (Moving Picture Experts Group) block from among a plurality of MPEG blocks in accordance with certain aspects of the invention.

FIG. 19A is a diagram illustrating an embodiment of determination of index usage (shown as Q index) within a CP (Control Packet) MPEG block in accordance with certain aspects of the invention.

FIG. 19B is a diagram illustrating an embodiment of possible format of a CP MPEG block that may be employed in accordance with certain aspects of the invention.

FIG. 19C is a diagram illustrating another embodiment of possible format of a CP MPEG block that may be employed in accordance with certain aspects of the invention.

FIG. 20 is a diagram illustrating an embodiment of general format of a QB (Queue Block) descriptor (employing 2 bytes) in accordance with certain aspects of the invention.

FIG. 26 is a flowchart illustrating an embodiment of a method for adaptively changing frame structure and frame content based on operating conditions in accordance with certain aspects of the invention.

DETAILED DESCRIPTION OF THE INVENTION

Figure 2:
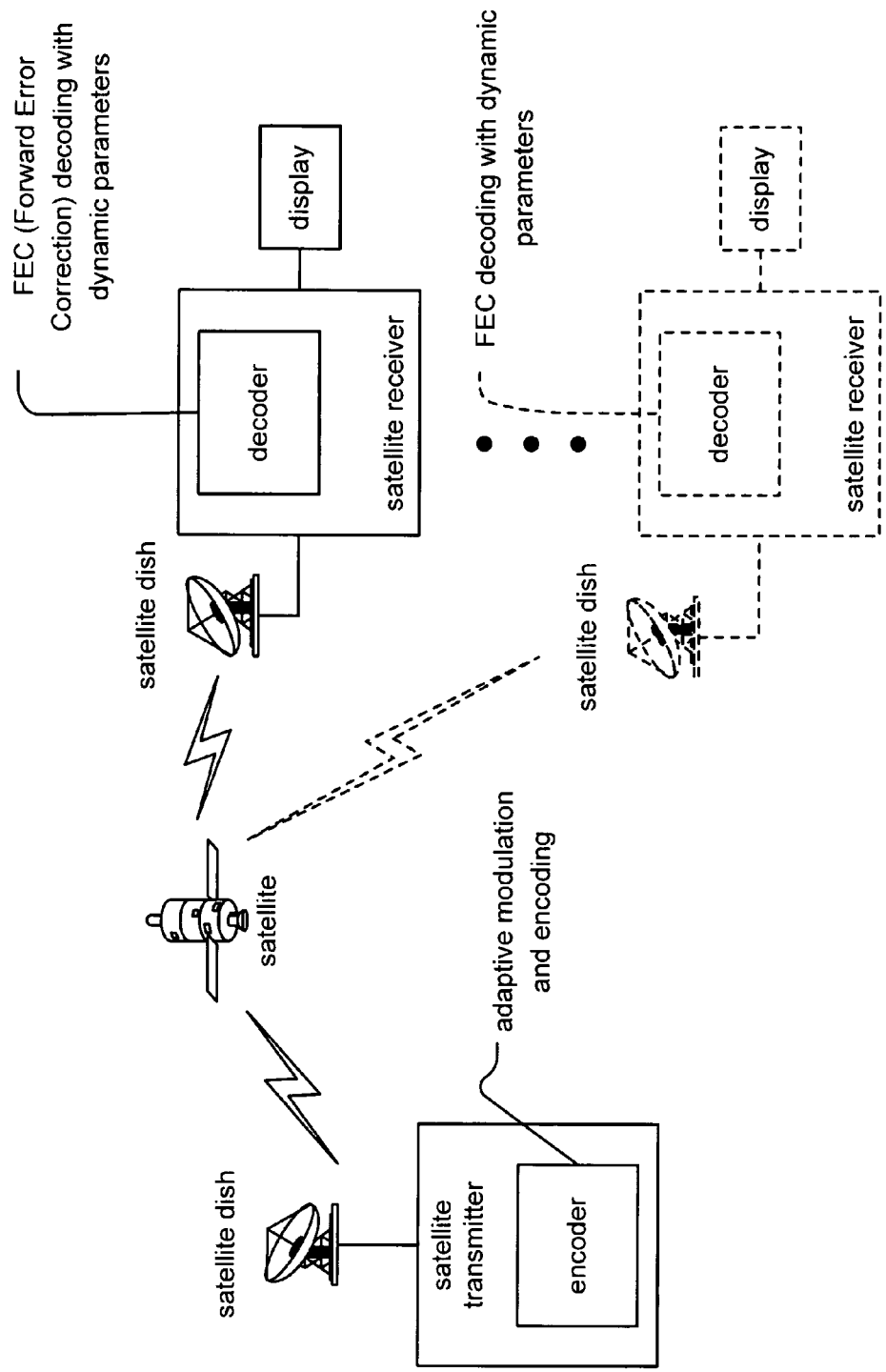
FIG. 2 is a system diagram illustrating an embodiment of a one-way satellite communication system that is built according to the invention.

A novel solution of employing a parameter extraction functional block that follows the FEC (Forward Error Correction) decoding functional block is introduced. Information on the FEC decoding operational parameters is embedded in the packets that come out of the FEC decoding functional block so that it is protected by the inherent error correctional functionality and benefits provided by the FEC employed within the communication device. This packet that includes the FEC operational parameters is referred to as a CP (Control Packet). As one particular example, in the context where the communication device performs FEC decoding on an MPEG (Moving Picture Experts Group (Note: this group is an International Standards Organisation/International Electrotechnical Commission)) stream (e.g., an MPEG-2 transport stream in some instances), the CP is referred to as a CP MPEG block within the MPEG stream. Clearly, other types of communication systems and protocols could also benefit from various aspects of the invention, and appropriately modified FEC block therein could also includes CP blocks in accordance with the scope and spirit of various aspects of the invention. Generally speaking, this block may be referred to as a CP. However, as a reminder, in many of the embodiments to follow, a FEC decoding chain operates on an MPEG stream including a number of MPEG blocks, and the CP is referred to as a CP MPEG block in such embodiments.

The CP specifies the FEC configurations for 1 or more FEC blocks following it (i.e., not just a singular FEC block immediately following the CP). There are two issues that must be dealt with appropriately to use this advantageous approach. A first issue is that the FEC parameters that are used to perform the FEC decoding of the CP must be known beforehand. This first issue may be dealt with quite easily by programming the FEC parameters for the CP as being of a default type (e.g., a predetermined type) that the FEC decoding functional block is easily able to decode.

A second issue is the manner of how to deal with the FEC blocks that follow the CP that have already arrived in the FEC decoding functional block by the time the CP is fully decoded by the FEC decoding functional block because of the inherent latency of the FEC decoding functional block. This second issue (latency) may be resolved by the approach presented below. The CPs specify the FEC configurations for the packets that are located some number of FEC blocks away from the CPs; there are intentionally left 1 or more FEC blocks after the CP for which the FEC operational parameters of the CP do not correspond. The distance between the various CPs and the packets that are to be FEC decoded using the FEC decoding parameter specified in the CP can be selected depending on the intrinsic FEC latency of the FEC decoding functional block.

Various communication devices and communication system embodiments are described initially below in which many of the various aspects of the invention may be implemented. In general, any communication device that performs encoding and/or decoding of signals may benefit from the invention. Generally speaking, the processing operations at the transmitter end of a communication channel may be performed in accordance with adaptive modulation and encoding, and the processing operations at the receiver end of a communication channel may be performed in accordance with FEC (Forward Error Correction) decoding with dynamic parameters.

FIG. 2 is a system diagram illustrating an embodiment of a one-way satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, other wired networks, and/or WANs (Wide Area Networks). The satellite transmitter employs the satellite dish to communicate to the satellite via a wireless communication channel. The satellite is able to communicate with one or more satellite receivers (each oftentimes having a corresponding satellite dish). Each of the satellite receivers may also be communicatively coupled to a corresponding display.

Here, the communication to and from the satellite may cooperatively be viewed as being a wireless communication channel, or each of the communication links to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) in a manner in accordance with the functionality and/or processing of at least some of the various aspects of the invention to assist in generating a signal that is to be launched into the communication channel coupling the satellite transmitter and the satellite receiver. The satellite receiver is operable to decode a signal (using a decoder) received from the communication channel in a manner in accordance with the functionality and/or processing of at least some of the various aspects of the invention. This diagram shows one embodiment where one or more of the various aspects of the invention may be found.

Figure 3:
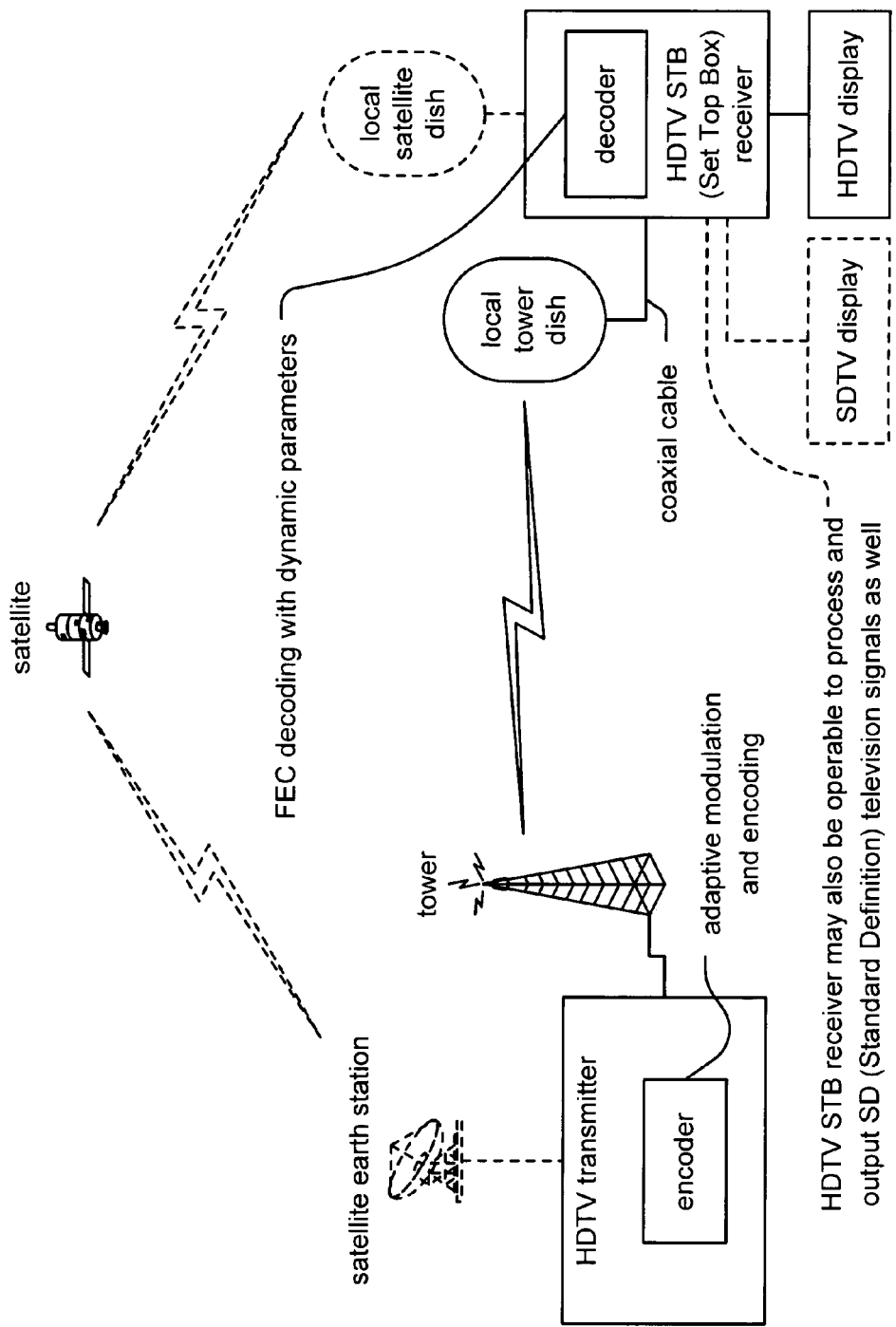
FIG. 3 is a system diagram illustrating an embodiment of an HDTV (High Definition Television) communication system that is built according to the invention.

FIG. 3 is a system diagram illustrating an embodiment of an HDTV (High Definition Television) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV STB (Set Top Box) receiver via a coaxial cable. The HDTV STB receiver includes the functionality to receive the wireless transmitted signal that has been received by the local tower dish. This functionality may include any transformation and/or down-converting that may be needed to accommodate for any up-converting that may have been performed before and during transmission of the signal from the HDTV transmitter and its corresponding tower to transform the signal into a format that is compatible with the communication channel across which it is transmitted. For example, certain communication systems step a signal that is to be transmitted from a baseband signal to an IF (Intermediate Frequency) signal, and then to a carrier frequency signal before launching the signal into a communication channel. Alternatively, some communication systems perform a conversion directly from baseband to carrier frequency before launching the signal into a communication channel. In whichever case is employed within the particular embodiment, the HDTV STB receiver is operable to perform any down-converting that may be necessary to transform the received signal to a baseband signal that is appropriate for demodulating and decoding to extract the information there from.

The HDTV STB receiver is also communicatively coupled to an HDTV display that is able to display the demodulated and decoded wireless transmitted signals received by the HDTV STB receiver and its local tower dish. The HDTV STB receiver may also be operable to process and output standard definition television signals as well. For example, when the HDTV display is also operable to display standard definition television signals, and when certain video/audio is only available in standard definition format, then the HDTV STB receiver is operable to process those standard definition television signals for use by the HDTV display.

The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is ultimately destined for the HDTV STB receiver. For example, another satellite earth station may first transmit a signal to the satellite from another location, and the satellite may relay this signal to the satellite earth station that is communicatively coupled to the HDTV transmitter. In such a case the HDTV transmitter include transceiver functionality such that it may first perform receiver functionality and then perform transmitter functionality to transmit this received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV STB receiver via a coaxial cable. This path of transmission shows yet another communication path where the HDTV STB receiver may communicate with the HDTV transmitter.

In whichever embodiment and by whichever signal path the HDTV transmitter employs to communicate with the HDTV STB receiver, the HDTV STB receiver is operable to receive communication transmissions from the HDTV transmitter and to demodulate and decode them appropriately.

The HDTV transmitter is operable to encode information (using an encoder) in a manner in accordance with the functionality and/or processing of at least some of the various aspects of the invention to assist in generating a signal that is to be launched into the communication channel coupling the HDTV transmitter and the HDTV STB receiver. The HDTV STB receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 4:
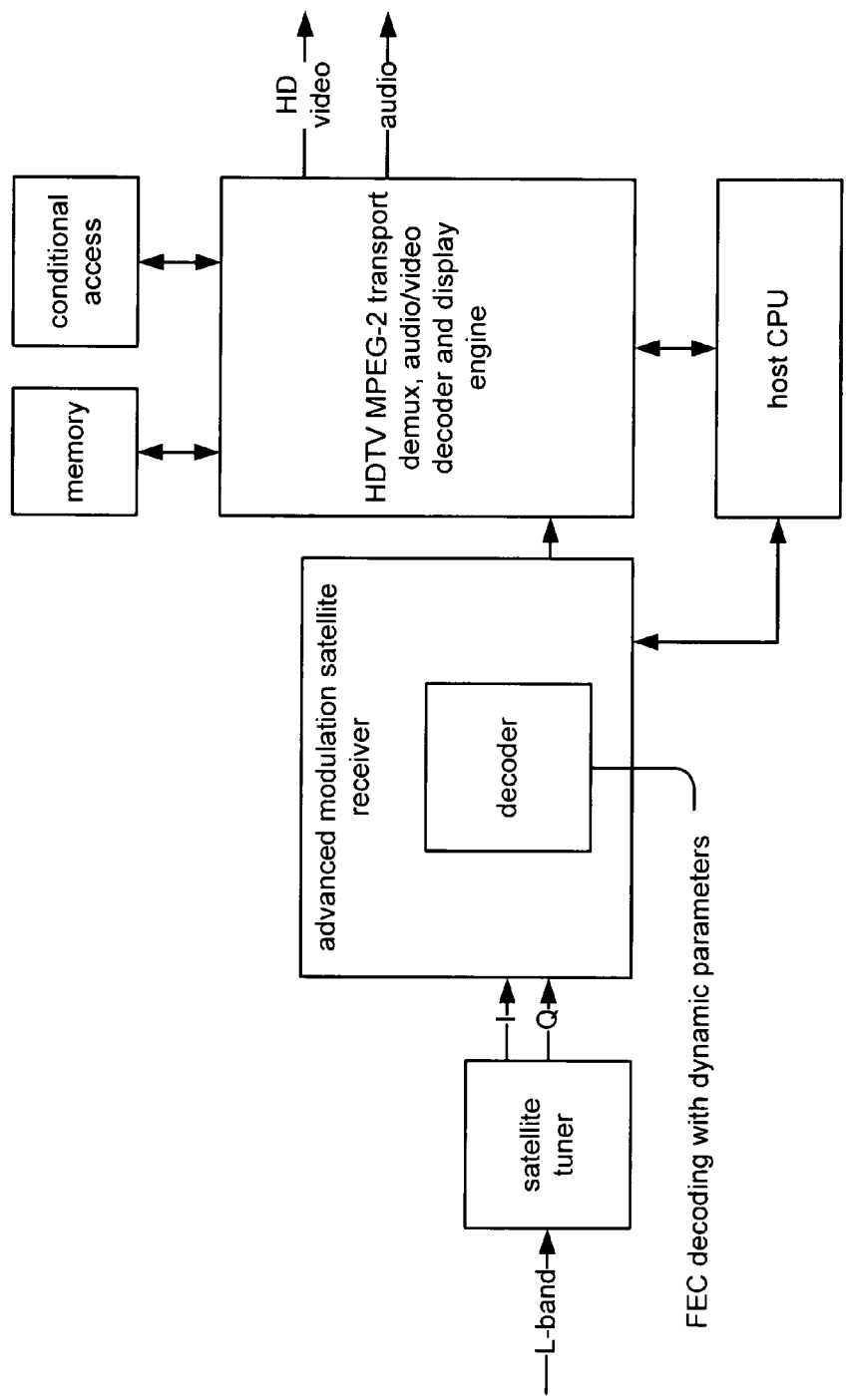
FIG. 4 is a system diagram illustrating an embodiment of a satellite receiver STB (Set Top Box) system that is built according to the invention.

FIG. 4 is a system diagram illustrating an embodiment of a satellite receiver STB (Set Top Box) system that is built according to the invention. The satellite receiver STB system includes an advanced modulation satellite receiver that is implemented in an all digital architecture. Moreover, the advanced modulation satellite receiver may be implemented within a single integrated circuit in some embodiments. The satellite receiver STB system includes a satellite tuner that receives a signal via the L-band (e.g., within the frequency range between 390-1550 MHz (Mega-Hertz) in the ultrahigh radio frequency range). The satellite tuner extracts I, Q (In-phase, Quadrature) components from a signal received from the L-band and provides them to the advanced modulation satellite receiver. The advanced modulation satellite receiver includes a decoder.

As within other embodiments that employ a decoder, the decoder is operable to decode a signal received from a communication channel to which the advanced modulation satellite receiver is coupled in a manner in accordance with the functionality and/or processing of at least some of the various aspects of the invention. This diagram shows yet another embodiment where one or more of the various aspects of the invention may be found.

The advanced modulation satellite receiver may be implemented to communicatively couple to an HDTV MPEG-2 (Motion Picture Expert Group, level 2) transport de-mux, audio/video decoder and display engine. The advanced modulation satellite receiver and the HDTV MPEG-2 transport de-mux, audio/video decoder and display engine communicatively couple to a host CPU (Central Processing Unit). The HDTV MPEG-2 transport de-mux, audio/video decoder and display engine also communicatively couples to a memory module and a conditional access functional block. The HDTV MPEG-2 transport de-mux, audio/video decoder and display engine provides HD (High Definition) video and audio output that may be provided to an HDTV display.

The advanced modulation satellite receiver may be implemented as a single-chip digital satellite receiver supporting the decoder that operates in a manner in accordance with the functionality and/or processing of at least some of the various aspects of the invention. The advanced modulation satellite receiver is operable to receive communication provided to it from a transmitter device that includes an encoder as well.

Figure 5:
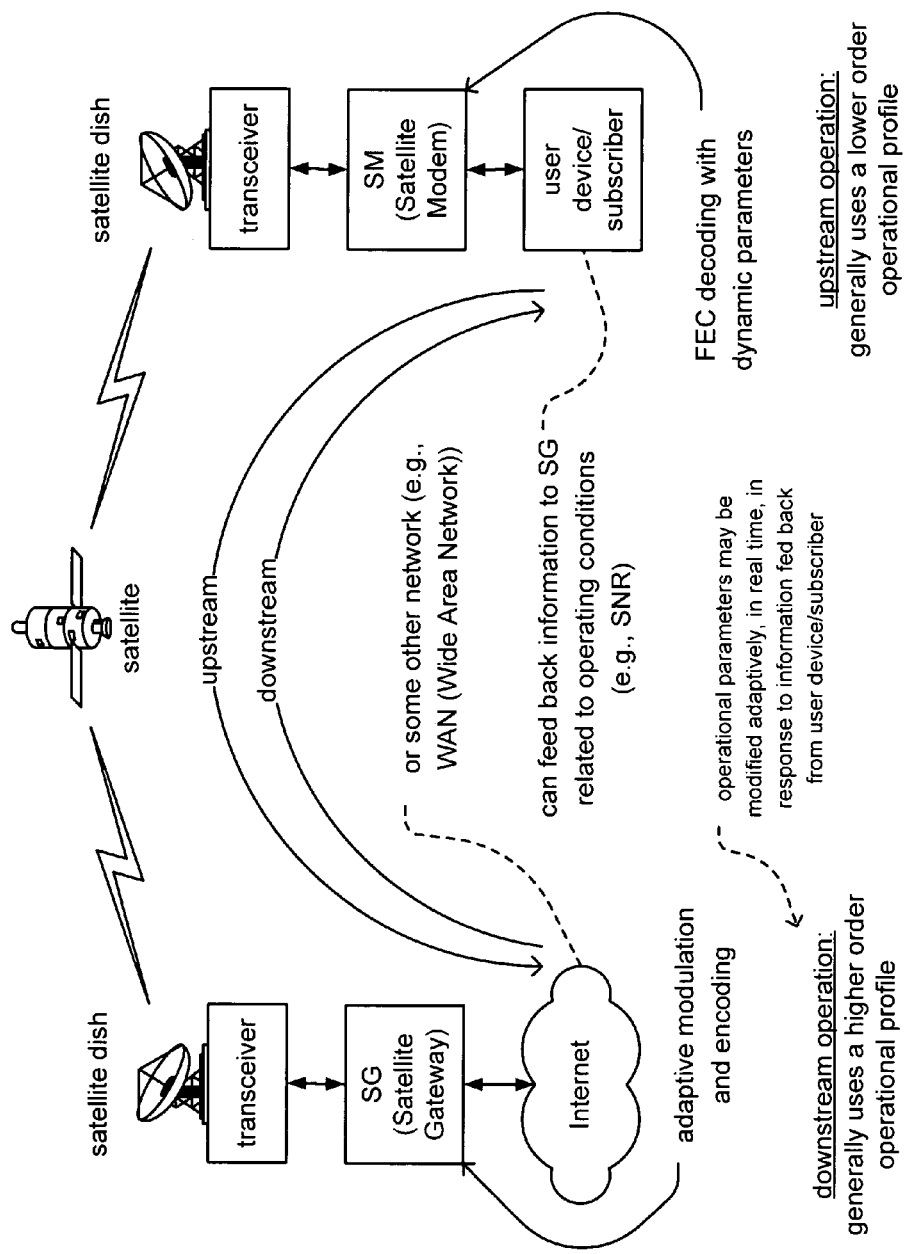
FIG. 5 is a diagram illustrating an embodiment of basic elements of a two way satellite data system according to the invention.

FIG. 5 is a diagram illustrating an embodiment of basic elements of a two way satellite data system according to the invention. A SG (Satellite Gateway) with a baseband modulator/demodulator receives data from a network, such as the Internet, or some other WAN (Wide Area Network). At the transmitting end of the communication system, data is assembled (e.g., encoded and modulated) into an appropriate format in accordance with a predetermined format in the SG and is then provided to a transceiver communicatively coupled thereto. This format of data assembly may be performed in accordance with any of a variety of means including any of the various the DOCSIS (Data Over Cable Service Interface Specification) architectures. This transceiver is operable to perform certain functions necessary for transmitting the data using the satellite dish, up to the satellite and down to one or more SMs (Satellite Modems) over a downstream communication channel. The downstream signal is received by the satellite dish at the user end of the communication channel, processed by the transceiver communicatively coupled thereto, and demodulated and subsequently decoded by the SM. The SM transmits data, generated by a CPE (Customer Premise(s) Equipment), shown as a user device/subscriber, back to the SG over the upstream communication channel (via the satellite and the corresponding satellite dishes and transceivers at each end of the communication channel) using a format recognized by the SG.

The SG is operable to encode information (using an encoder) in a manner in accordance with the functionality and/or processing of at least some of the various aspects of the invention to assist in generating a signal that is to be launched into the communication channel coupling the satellite dish and the corresponding transceiver. The SM is operable to decode a signal (using a decoder) received from the communication channel in a manner in accordance with the functionality and/or processing of at least some of the various aspects of the invention. This diagram shows yet another embodiment where one or more of the various aspects of the invention may be found.

Generally speaking, the communication sent downstream from the SG to the SM is performed using a relatively higher order operational profile, and the communication sent upstream from the SG to the SM is performed using a relatively lower order operational profile. In some instances, the SM end is operable to assess various indicia corresponding to the operating conditions of the communication channel and to provide that information back to the SG. In response to this information provided to the SG end of the communication channel, the SG can adaptively modify the various parameters within its operational profile. For example, the SG can modify, in real time, any 1 or more of the various operational parameters within the downstream operational profile.

Figure 6:
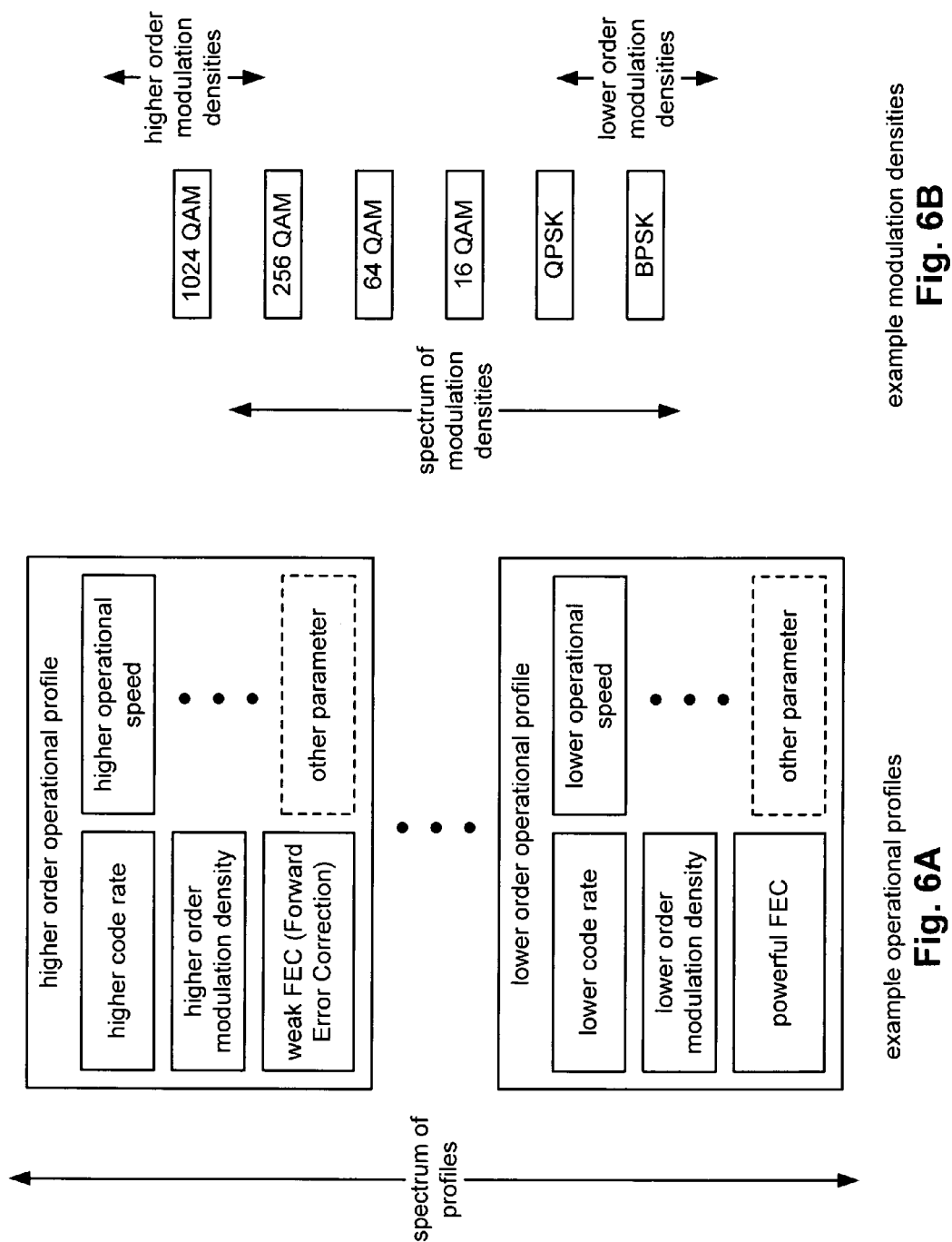
FIG. 6A is a diagram illustrating example operational profiles that may be employed according to the invention.
FIG. 6B is a diagram illustrating example modulation densities that may be employed according to the invention.

FIG. 6A is a diagram illustrating example operational profiles that may be employed according to the invention. A spectrum of operational profiles may be used to service both the upstream and downstream transmission within a communication system. Generically speaking, a higher order operational profile may be used to service downstream communications, and a lower order operational profile may be used to service upstream communications.

The higher order profile may be viewed as having a relatively higher code rate, a relatively higher modulator density, relatively weak FEC (Forward Error Correction), relatively higher operational speed, and other parameters as required or desired. The lower order profile may be viewed as having a relatively lower code rate, a relatively lower modulator density (when compared to the higher order modulator density of the higher order profile), relatively powerful FEC (when compared to the weaker FEC of the higher order profile), relatively lower operational speed, and other parameters as required or desired. Generally speaking, the parameters of the lower order operational profile are much more robust than the parameters of the higher order operational profile.

FIG. 6B is a diagram illustrating example modulation densities that may be employed according to the invention. The spectrum of modulation densities involves higher order modulation densities and lower order modulation densities. For example, the spectrum of modulation densities ranges from 1024 QAM (Quadrature Amplitude Modulation), 256 QAM, 64 QAM, 16 QAM, QPSK (Quadrature Phase Shift Keying), and BPSK (Binary Phase Shift Keying). Other modulation schemes could similarly be employed and arranged in an increasing/decreasing order of density without departing from the scope and spirit of the invention. The higher order modulation densities may be viewed as including the 1024 QAM and 256 QAM, and the lower order modulation densities may be viewed as including the 16 QAM, QPSK, and BPSK. In some embodiments, a higher order modulation density may be viewed as including only 16 QAM, and a lower order modulation density may be viewed as including only QPSK.

Generically speaking, a higher order modulation density may be used to service downstream communications, and a lower higher order modulation density may be used to service upstream communications.

These diagrams of FIG. 6A and FIG. 6B show just some of the possible variations of operational parameters that may be employed, and adaptively modified, when operating within a communication system in accordance with the invention. For example, certain of these various operational parameters may be modified based on the operating conditions of the communication system.

Figure 7:
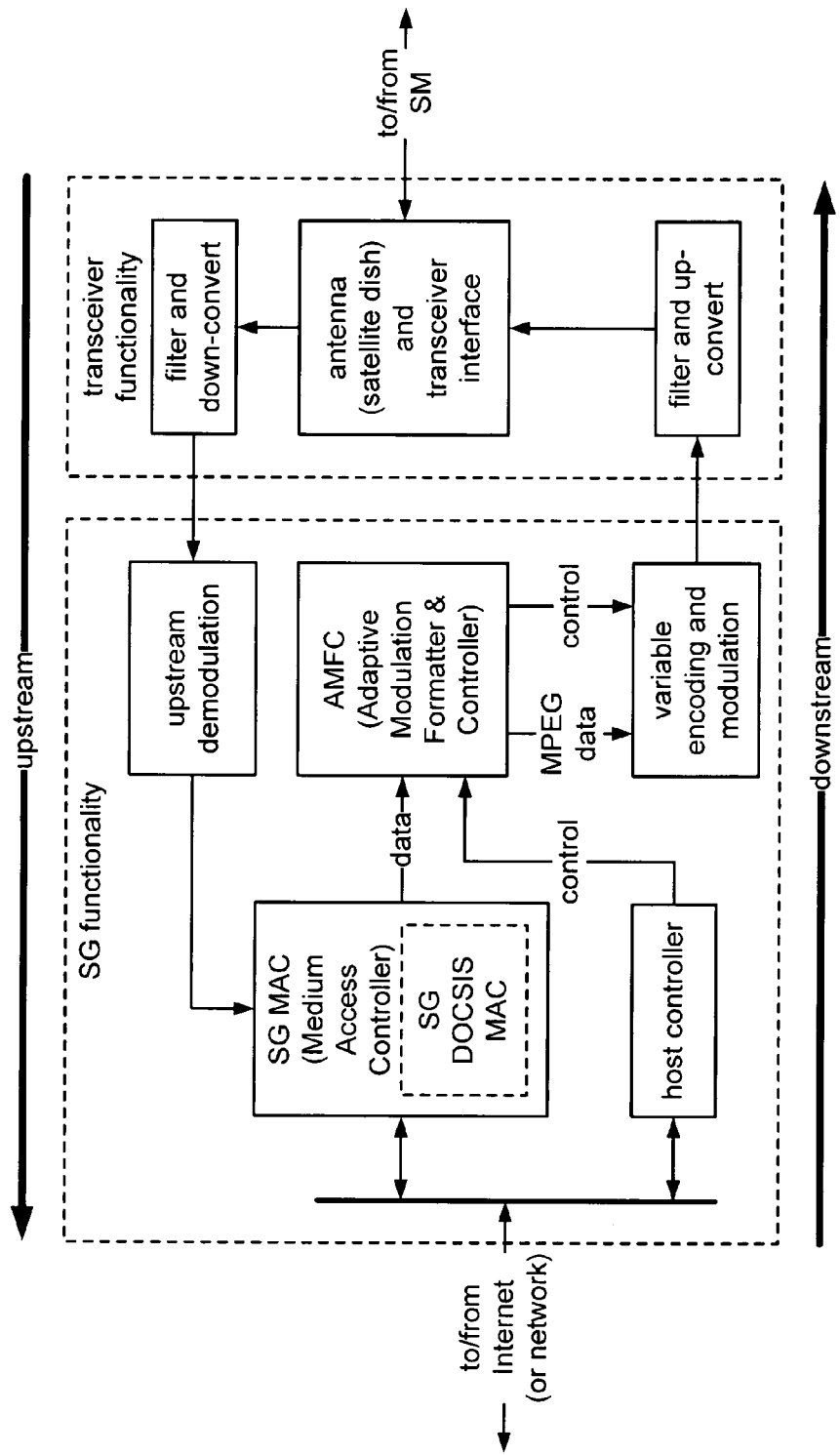
FIG. 7 is a block diagram illustrating the processing blocks of an embodiment of a SG (Satellite Gateway), that incorporates the Downstream Adaptive Modulation (DS-AM) functionality in accordance with various aspects of the invention.

FIG. 7 is a block diagram illustrating the processing blocks of an embodiment of a SG (Satellite Gateway), that incorporates the Downstream Adaptive Modulation (DS-AM) functionality in accordance with various aspects of the invention. This diagram includes the various processing blocks of an SG, along with the processing blocks of the corresponding transceiver communicatively coupled thereto. Data from a network, such as the Internet or some other WAN (Wide Area Network), is transmitted between the network and the gateway SG MAC. This SG MAC may be implemented as an SG DOCSIS MAC in certain embodiments. The data is formatted in accordance with the protocol employed therein (e.g., the DOCSIS protocol in DOCSIS type systems). This protocol uses an MPEG (Moving Picture Experts Group) format in the "downstream transmission convergence sublayer" that serves as the interface between the MAC and PHY (physical layer). Each of the various MPEG specifications is publicly available and is incorporated herein by this reference for all purposes.

The downstream MPEG data stream that is output from the SG MAC processing block is provided to an AMFC (Adaptive Modulation and Formatter & Controller) stage that receives and processes the appropriately encapsulated traffic received from the SG MAC processing block. The modulation type and/or FEC parameters employed by the AMFC may be adaptively modified based on the operating conditions of the overall communication system. An interface could be a MPEG data stream compliant with the downstream transmission convergence sub-layer, or it could have an alternative format. The SG also includes a variable encoding & modulation stage, which is a modulator that is capable of having its modulation type and FEC encoding parameters dynamically controlled on a QB (Queue Block) by QB basis.

The appropriately encoded and modulated MPEG stream is then up converted and filtered, and then fed into a high PA (Power Amplifier) by the transceiver. This signal is transmitted continuously in a single frequency band, through a satellite and received by one or more subscriber SMs.

The SG also receives (e.g., via a satellite dish) the upstream signal transmitted by one or more subscriber SMs of the communication system. The signal is filtered and down converted back to baseband using appropriate demodulation and decoding parameters to recover the upstream data stream.

Figure 8:
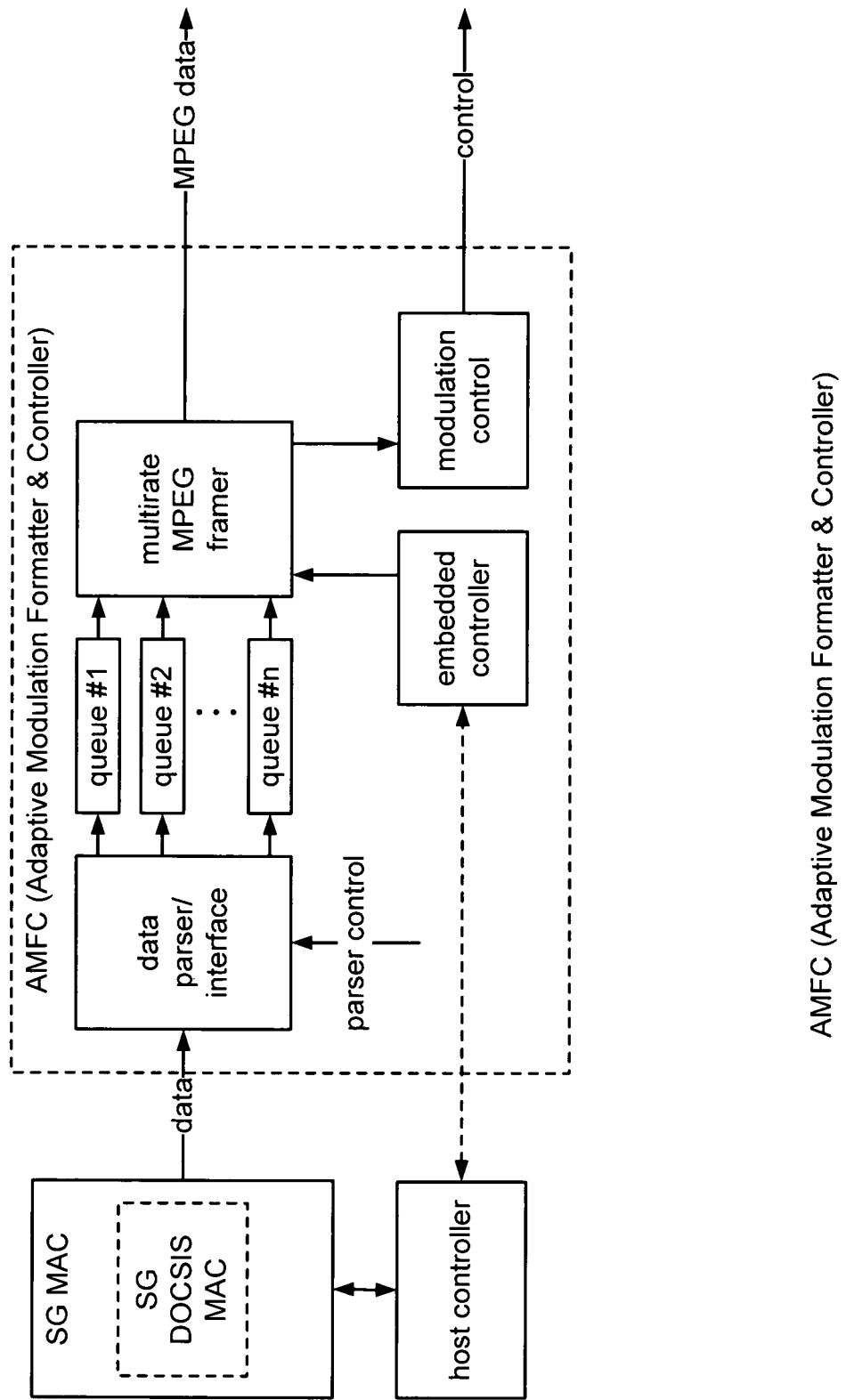
FIG. 8 is a diagram illustrating a block diagram of the AMFC (Adaptive Modulation Formatter & Controller) of the FIG. 7.

FIG. 8 is a diagram illustrating a block diagram of the AMFC (Adaptive Modulation Formatter & Controller) of the FIG. 7.

The host controller receives downstream signal quality information for each of the particular SMs over the upstream channel. The SM is an embodiment of a satellite modem that is operable to receive and decode downstream transmissions from the SG that have been adaptively modulated and encoded using the DS-AM functionality (i.e., method and apparatus) of the invention. The SM is discussed in more detail below.

The downstream signal quality for each SM can be based on, for example, the SNR (Signal to Noise Ratio), packet or code word error rate, or other parameters defining signal quality. The SM can be made to monitor that information continuously, so that any changes in the signal quality may be dynamically reflected at the SG and communicated thereto from the SM. Different sets of operational profiles (including values for code rate, modulation density and/or modulation type, FEC type, and/or FEC rate) are defined spanning the range of expected signal quality.

An example of a set of four profiles based on SNR as a signal quality measurement is shown below in Table 1. As Table 1 illustrates, the profiles trade-off higher throughput (shown as higher bandwidth efficiency in Table 1) for higher required signal quality. Clearly, Table 1 is only a hypothetical example. Other operational profiles with different performance characteristics and different transmission parameters could be specified while staying within the scope of the invention.

TABLE 1

Example Transmission Parameter Profiles for DS-AM

| Profile | Modulation | FEC Rate | Bandwidth Efficiency [bits/sec/Hz] | Required SNR |
|---|---|---|---|---|
| 1 | QPSK | 1/2 | 1.0 | 3.0 |
| 2 | QPSK | 3/4 | 1.5 | 6.0 |
| 3 | 8 PSK | 2/3 | 2.0 | 9.0 |
| 4 | 16 QAM | 3/4 | 3.0 | 12.0 |

The host controller assigns each of the different profiles to one or more of the queues. Put another way, each packet queue is associated with a unique modulation order and/or FEC code rate that defines a throughput rate in the form of bandwidth efficiency (i.e., bits per second per 1 Hz of bandwidth). Traffic for a given SM is then assigned to a specific queue or set of the queues having an assigned operational profile that is appropriate for the downstream quality information provided by that SM. Sufficient information is associated with each packet to allow it to be assigned to the proper queue. For example, in the DOCSIS context, the packets can be assigned to the different queues by means of the DOCSIS DA (Destination Address), SID (Service ID), or any other unique identifier that is available with the DOCSIS protocol.

The AMFC receives the data stream from the SG MAC. In the DOCSIS context, DOCSIS packets destined for individual SMs are parsed and placed in their assigned packet queues. One possible format for the data interface between the SG MAC and the AMFC is an MPEG format.

Figure 9:
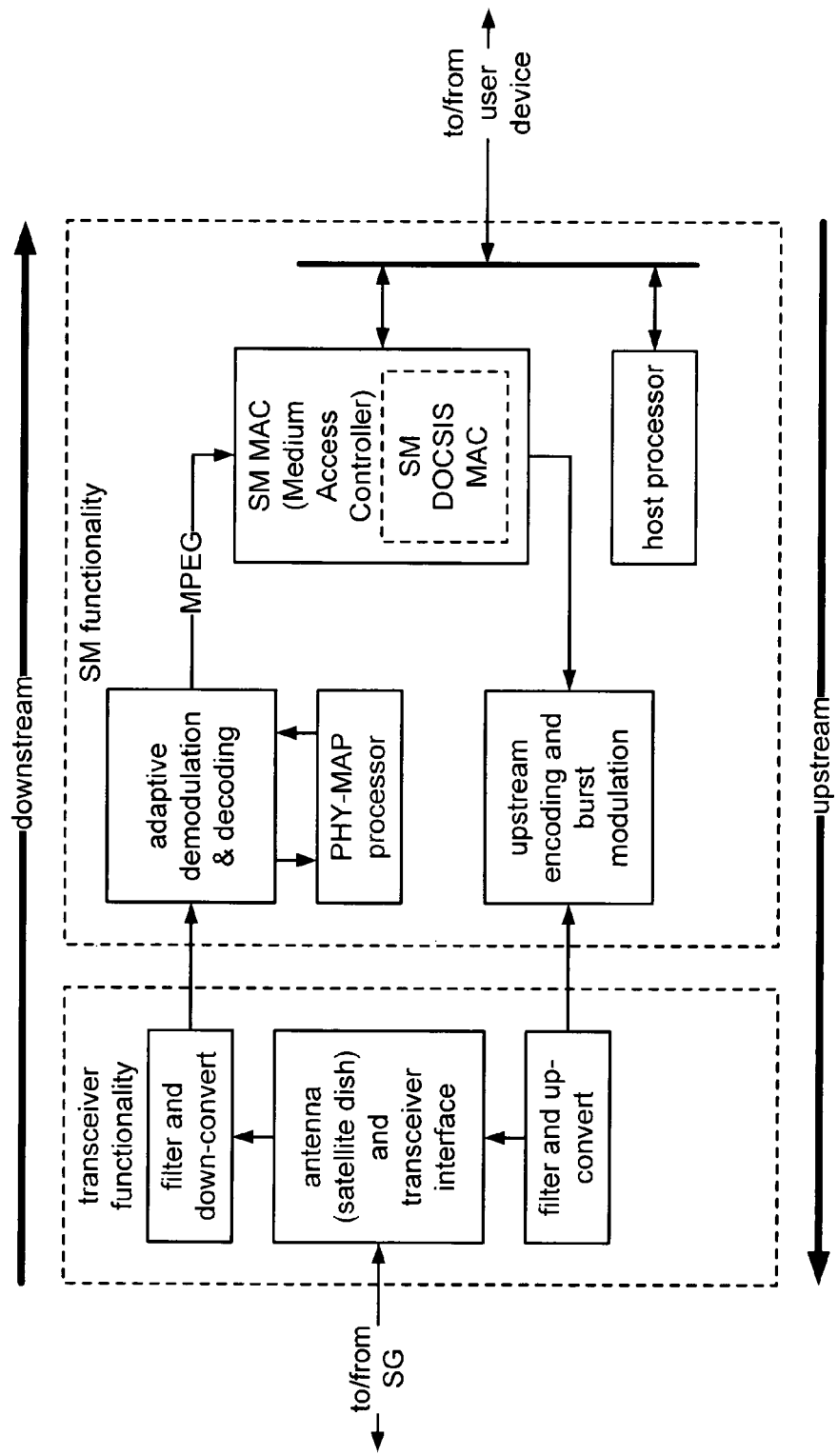
FIG. 9 is a block diagram illustrating the processing blocks of an embodiment of a SM (Satellite Modem), which incorporates the DS-AM functionality in accordance with various aspects of the invention.

FIG. 9 is a block diagram illustrating the processing blocks of an embodiment of a SM (Satellite Modem), which incorporates the DS-AM functionality in accordance with various aspects of the invention. As previously discussed, the SMs must be able to decode and demodulate the adaptively modulated stream. This diagram is a block diagram illustrating the processing blocks of an embodiment of a SM, which incorporates the DS-AM method and apparatus of various aspects of the invention. The adaptive demodulation and decoding block decodes the PHY-MAP message sent from the SG. This message is used to determine the proper demodulation and decoding parameters to use during the proper time intervals (i.e. for each QB). The SM is operable to decode and demodulate the most robust data packet queue to extract the timestamp and MAC management messages sent to all SMs.

The SMs use the MAC management messages to set up an upstream channel to the SG. SM uses this upstream channel to send downstream signal quality metrics to the host of the SG. This could be implemented as part of the ranging and registration process common to these systems or as separate MAC messages. Based on its signal quality, each SM identifies the maximum downstream throughput rate that it can handle with acceptable fidelity, and decodes data received from the packet queue assigned to handle that throughput rate as well as from any queue having a more robust profile. If any packet queue cannot be demodulated by the SM with appropriate fidelity, the SM fills output MPEG frames corresponding to that queue with null MPEG frames, or otherwise blanks the data sent to the SM DOCSIS MAC. The decoded stream is transmitted to the SM DOCSIS MAC over the appropriate output port.

The SG uses the PHY-MAP for flexible and optimized assignment of QBs to the downstream. As channel conditions or traffic loading changes, the PHY-MAP can be dynamically adjusted to optimize efficiency. Decoding all possible queues by the SM assures that all SMs will receive PHY-MAP messages and multi-cast traffic over the packet queue having the most robust modulation and encoding. It also permits the SG the flexibility to assign traffic destined for a given SM to the queue having the highest possible throughput, or to any of the more robust queues.

Figure 10:
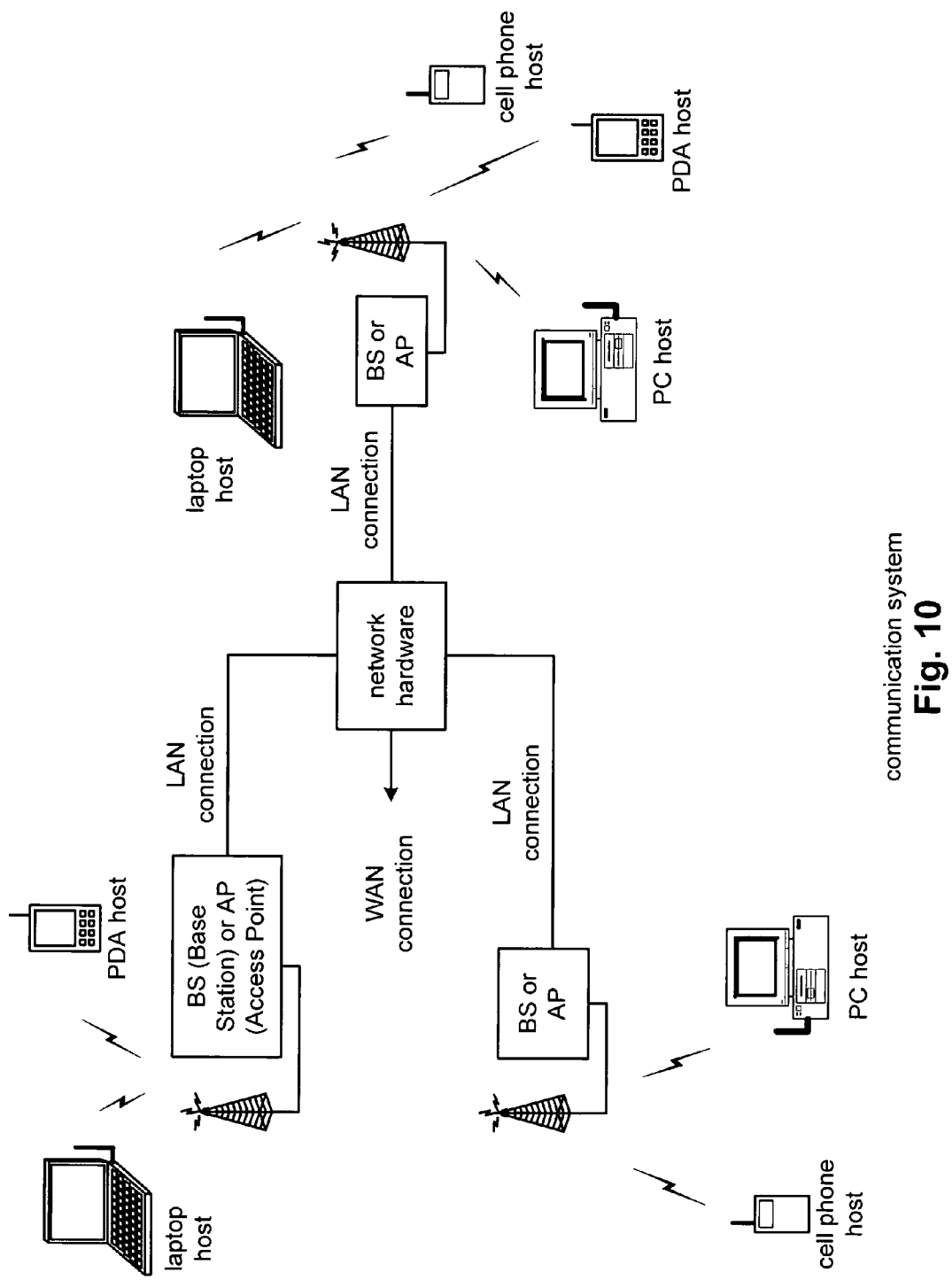
FIG. 10 is a schematic block diagram illustrating a communication system that includes a plurality of base stations and/or access points, a plurality of wireless communication devices and a network hardware component in accordance with certain aspects of the invention.

FIG. 10 is a schematic block diagram illustrating a communication system that includes a plurality of base stations and/or access points, a plurality of wireless communication devices and a network hardware component in accordance with certain aspects of the invention. The wireless communication devices may be laptop host computers, PDA (Personal Digital Assistant) hosts, PC (Personal Computer) hosts and/or cellular telephone hosts. The details of any one of these wireless communication devices is described in greater detail with reference to FIG. 11 below.

The BSs (Base Stations) or APs (Access Points) are operably coupled to the network hardware via the respective LAN (Local Area Network) connections. The network hardware, which may be a router, switch, bridge, modem, system controller, etc., provides a WAN (Wide Area Network) connection for the communication system. This WAN connection may couple to the Internet in some embodiments. Each of the BSs or APs has an associated antenna or antenna array to communicate with the wireless communication devices in its area. Typically, the wireless communication devices register with a particular BS or AP to receive services from the communication system. For direct connections (i.e., point-to-point communications), wireless communication devices communicate directly via an allocated channel.

Typically, BSs are used for cellular telephone systems and like-type systems, while APs are used for in-home or in-building wireless networks. Regardless of the particular type of communication system, each wireless communication device includes a built-in radio and/or is coupled to a radio. The radio includes a highly linear amplifier and/or programmable multi-stage amplifier to enhance performance, reduce costs, reduce size, and/or enhance broadband applications.

Figure 11:
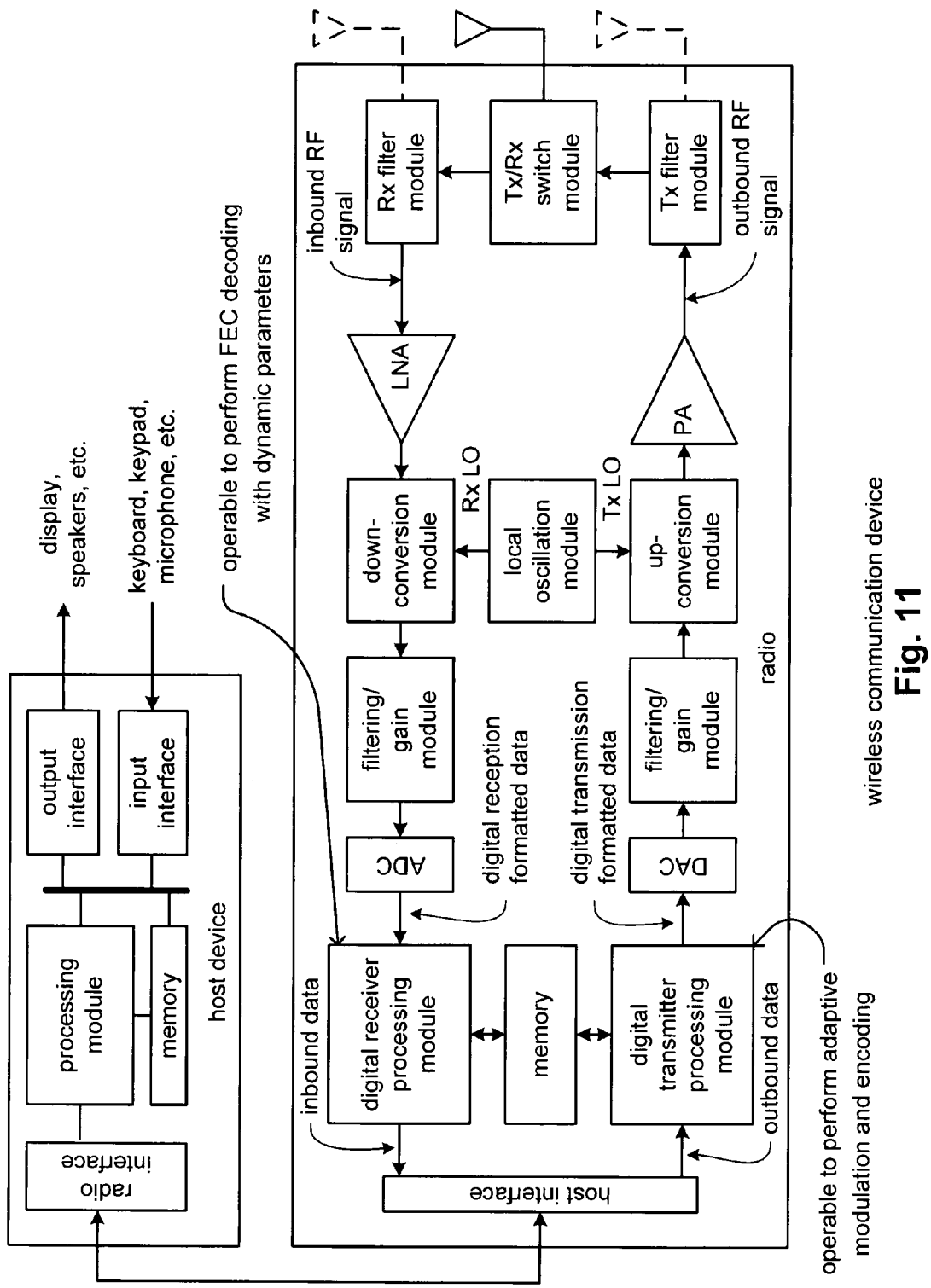
FIG. 11 is a schematic block diagram illustrating a wireless communication device that includes the host device and an associated radio in accordance with certain aspects of the invention.

FIG. 11 is a schematic block diagram illustrating a wireless communication device that includes the host device and an associated radio in accordance with certain aspects of the invention. For cellular telephone hosts, the radio is a built-in component. For PDA (Personal Digital Assistant) hosts, laptop hosts, and/or personal computer hosts, the radio may be built-in or an externally coupled component.

As illustrated, the host device includes a processing module, memory, radio interface, input interface and output interface. The processing module and memory execute the corresponding instructions that are typically done by the host device. For example, for a cellular telephone host device, the processing module performs the corresponding communication functions in accordance with a particular cellular telephone standard or protocol.

The radio interface allows data to be received from and sent to the radio. For data received from the radio (e.g., inbound data), the radio interface provides the data to the processing module for further processing and/or routing to the output interface. The output interface provides connectivity to an output display device such as a display, monitor, speakers, etc., such that the received data may be displayed or appropriately used. The radio interface also provides data from the processing module to the radio. The processing module may receive the outbound data from an input device such as a keyboard, keypad, microphone, etc., via the input interface or generate the data itself. For data received via the input interface, the processing module may perform a corresponding host function on the data and/or route it to the radio via the radio interface.

The radio includes a host interface, a digital receiver processing module, an ADC (Analog to Digital Converter), a filtering/gain module, an IF (Intermediate Frequency) mixing down conversion stage, a receiver filter, an LNA (Low Noise Amplifier), a transmitter/receiver switch, a local oscillation module, memory, a digital transmitter processing module, a DAC (Digital to Analog Converter), a filtering/gain module, an IF mixing up conversion stage, a PA (Power Amplifier), a transmitter filter module, and an antenna. The antenna may be a single antenna that is shared by the transmit and the receive paths as regulated by the Tx/Rx (Transmit/Receive) switch, or may include separate antennas for the transmit path and receive path. The antenna implementation will depend on the particular standard to which the wireless communication device is compliant.

The digital receiver processing module and the digital transmitter processing module, in combination with operational instructions stored in memory, execute digital receiver functions and digital transmitter functions, respectively. The digital receiver functions include, but are not limited to, digital IF (Intermediate Frequency) to baseband conversion, demodulation, constellation de-mapping, decoding, and/or descrambling. The digital transmitter functions include, but are not limited to, scrambling, encoding, constellation mapping, modulation, and/or digital baseband to IF conversion.

Similarly to other embodiments that employ an encoder and a decoder (or perform encoding and decoding), the encoding operations that may be performed by the digital transmitter processing module may be implemented in a manner in accordance with the functionality and/or processing of at least some of the various aspects of the invention to assist in generating a signal that is to be launched into the communication channel coupling to the wireless communication device. Analogously, the decoding operations of the operations that may be performed by the digital transmitter processing module may be implemented in a manner in accordance with the functionality and/or processing of at least some of the various aspects of the invention. For example, the encoding operations performed by the digital transmitter processing module may be performed using adaptive modulation and encoding functionality as described and presented herein, and the decoding operations that may be performed by the digital receiver processing module may be performed using the FEC with dynamic parameters as also described and presented herein.

The digital receiver and transmitter processing modules may be implemented using a shared processing device, individual processing devices, or a plurality of processing devices. Such a processing device may be a microprocessor, micro-controller, DSP (Digital Signal Processor), microcomputer, CPU (Central Processing Unit), FPGA (Field Programmable Gate Array), programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a ROM (Read Only Memory), RAM (Random Access Memory), volatile memory, non-volatile memory, static memory, dynamic memory, flash memory, and/or any device that stores digital information. It is noted that when either of the digital receiver processing module or the digital transmitter processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio receives outbound data from the host device via the host interface. The host interface routes the outbound data to the digital transmitter processing module, which processes the outbound data in accordance with a particular wireless communication standard (e.g., IEEE 802.11, Bluetooth®, etc.) to produce digital transmission formatted data. The digital transmission formatted data is a digital base-band signal or a digital low IF signal, where the low IF typically will be in the frequency range of one hundred kHz (kilo-Hertz) to a few MHz (Mega-Hertz).

The DAC converts the digital transmission formatted data from the digital domain to the analog domain. The filtering/gain module filters and/or adjusts the gain of the analog signal prior to providing it to the IF mixing stage. The IF mixing stage converts the analog baseband or low IF signal into an RF signal based on a transmitter local oscillation provided by local oscillation module. The PA amplifies the RF signal to produce outbound RF signal, which is filtered by the transmitter filter module. The antenna transmits the outbound RF signal to a targeted device such as a base station, an access point and/or another wireless communication device.

The radio also receives an inbound RF signal via the antenna, which was transmitted by a BS, an AP, or another wireless communication device. The antenna provides the inbound RF signal to the receiver filter module via the Tx/Rx switch, where the Rx filter bandpass filters the inbound RF signal. The Rx filter provides the filtered RF signal to the LNA, which amplifies the signal to produce an amplified inbound RF signal. The LNA provides the amplified inbound RF signal to the IF mixing module, which directly converts the amplified inbound RF signal into an inbound low IF signal or baseband signal based on a receiver local oscillation provided by local oscillation module. The down conversion module provides the inbound low IF signal or baseband signal to the filtering/gain module. The filtering/gain module filters and/or gains the inbound low IF signal or the inbound baseband signal to produce a filtered inbound signal.

The ADC converts the filtered inbound signal from the analog domain to the digital domain to produce digital reception formatted data. In other words, the ADC samples the incoming continuous time signal thereby generating a discrete time signal (e.g., the digital reception formatted data).

The digital receiver processing module decodes, descrambles, demaps, and/or demodulates the digital reception formatted data to recapture inbound data in accordance with the particular wireless communication standard being implemented by radio. The host interface provides the recaptured inbound data to the host device via the radio interface.

As one of average skill in the art will appreciate, the wireless communication device of FIG. 11 may be implemented using one or more integrated circuits. For example, the host device may be implemented on one integrated circuit, the digital receiver processing module, the digital transmitter processing module and memory may be implemented on a second integrated circuit, and the remaining components of the radio, less the antenna, may be implemented on a third integrated circuit. As an alternate example, the radio may be implemented on a single integrated circuit. As yet another example, the processing module of the host device and the digital receiver and transmitter processing modules may be a common processing device implemented on a single integrated circuit. Further, the memories of the host device and the radio may also be implemented on a single integrated circuit and/or on the same integrated circuit as the common processing modules of processing module of the host device and the digital receiver and transmitter processing module of the radio.

Figure 12:
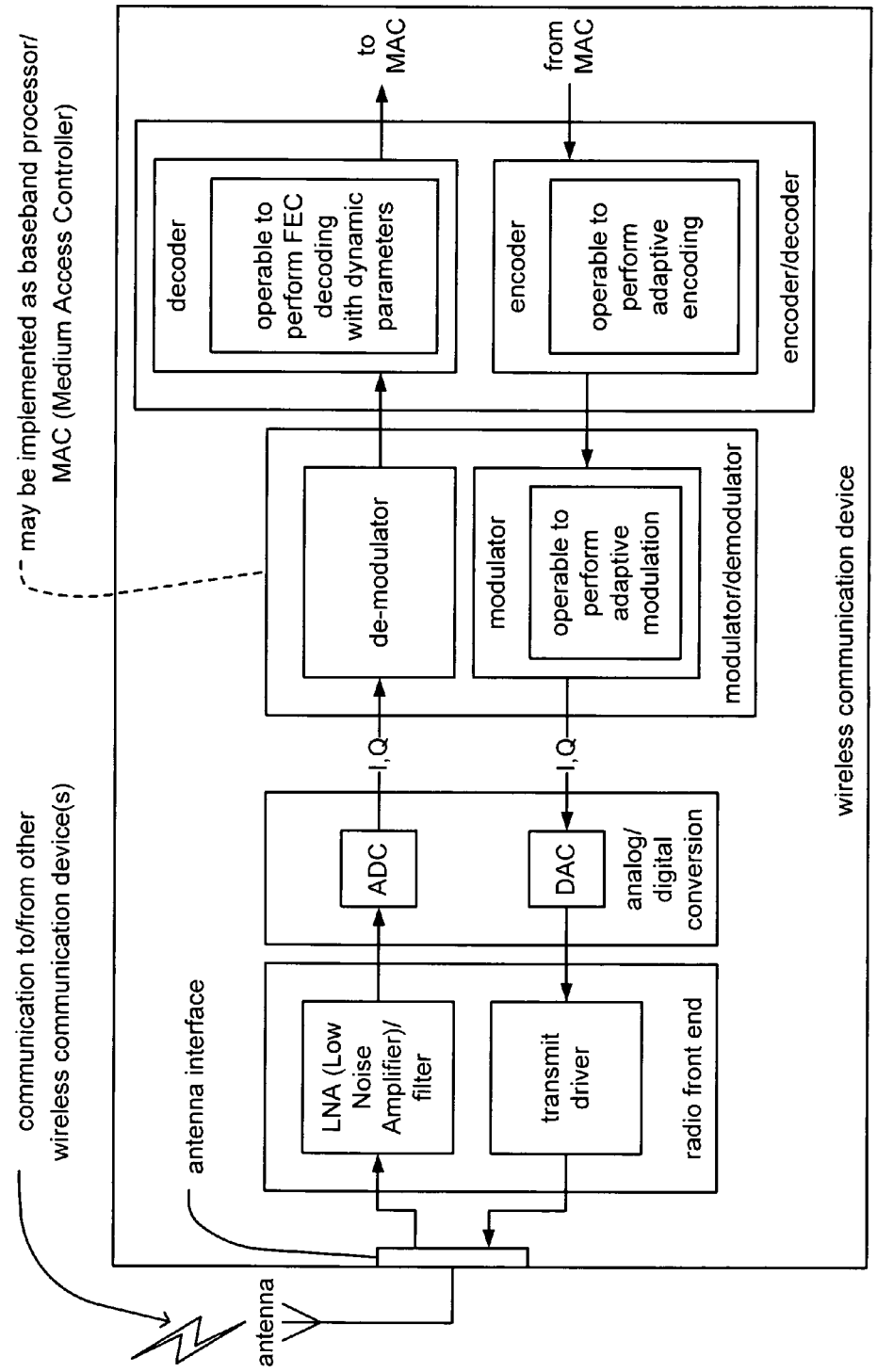
FIG. 12 is a diagram illustrating an alternative embodiment of a wireless communication device that is constructed according to the invention.

FIG. 12 is a diagram illustrating an alternative embodiment of a wireless communication device that is constructed according to the invention. This embodiment of a wireless communication device includes an antenna that is operable to communicate with any 1 or more other wireless communication devices. An antenna interface communicatively couples a signal to be transmitted from the wireless communication device or a signal received by the wireless communication device to the appropriate path (be it the transmit path or the receive path).

A radio front end includes receiver functionality and transmitter functionality. The radio front end communicatively couples to an analog/digital conversion functional block. The radio front end communicatively couples to a modulator/demodulator, and the radio front end communicatively couples to a encoder/decoder.

Along the Receive Path:

The receiver functionality of the front end includes a LNA (Low Noise Amplifier)/filter. The filtering performed in this receiver functionality may be viewed as the filtering that is limiting to the performance of the device, as also described above. The receiver functionality of the front end performs any down-converting that may be requiring (which may alternatively include down-converting directly from the received signal frequency to a baseband signal frequency). The general operation of the front end may be viewed as receiving a continuous time signal, and performing appropriate filtering and any down conversion necessary to generate the baseband signal. Whichever manner of down conversion is employed, a baseband signal is output from the receiver functionality of the front end and provided to an ADC (Analog to Digital Converter) that samples the baseband signal (which is also a continuous time signal, though at the baseband frequency) and generates a discrete time signal baseband signal (e.g., a digital format of the baseband signal); the ADC also extracts and outputs the digital I, Q (In-phase, Quadrature) components of the discrete time signal baseband signal.

These I, Q components are provided to a demodulator portion of the modulator/demodulator where any modulation decoding/symbol mapping is performed where the I, Q components of the discrete time signal baseband signal. The appropriate I, Q components are then mapped to an appropriate modulation (that includes a constellation and corresponding mapping). Examples of such modulations may include BPSK (Binary Phase Shift Key), QPSK (Quadrature Phase Shift Key), 8 PSK (8 Phase Shift Key), 16 QAM (16 Quadrature Amplitude Modulation), and even higher order modulation types. These demodulated symbols are then provided to a decoder portion of the encoder/decoder where FEC decoding using dynamic parameters is performed in accordance with the scope and spirit of various aspects of the invention. Additional details are also provided below with respect to the FEC decoding functionality illustrated in this and other embodiments.

Along the Transmit Path:

Somewhat analogous and opposite processing is performed in the transmit path when compared to the receive path. Information bits that are to be transmitted are encoded using an encoder of the encoder/decoder. These encoded bits are provided to a modulator of the modulator/demodulator where modulation encoding/symbol mapping may be performed according to the modulation of interest. It is also noted that the encoder is operable to perform adaptive encoding, and the modulator is operable to perform adaptive modulation in accordance with the scope and spirit of various aspects of the invention.

These now I, Q components of the symbols are then passed to a DAC (Digital to Analog Converter) of the analog/digital conversion functional block to transform the I, Q components into a continuous time transmit signal (e.g., an analog signal). Then, the continuous time transmit signal is passed to a transmit driver that performs any necessary up-converting/modification to the continuous time transmit signal (e.g., amplification and/or filtering) to comport it to the appropriate form for the communication channel over which the signal is to be transmitted. Once this continuous time transmit signal has undergone all of this appropriate processing, it may then be transmitted to another communication device via the antenna.

As within other embodiments that employ an encoder and a decoder, the encoder of this wireless communication device may be implemented to encode information in a manner in accordance with the functionality and/or processing of at least some of the various aspects of the invention to assist in generating a signal that is to be launched into the communication channel coupling to the wireless communication device. The decoder of the wireless communication device may be implemented to decode a received signal in a manner in accordance with the functionality and/or processing of at least some of the various aspects of the invention. This diagram shows yet another embodiment where one or more of the various aspects of the invention may be found.

Figure 13:
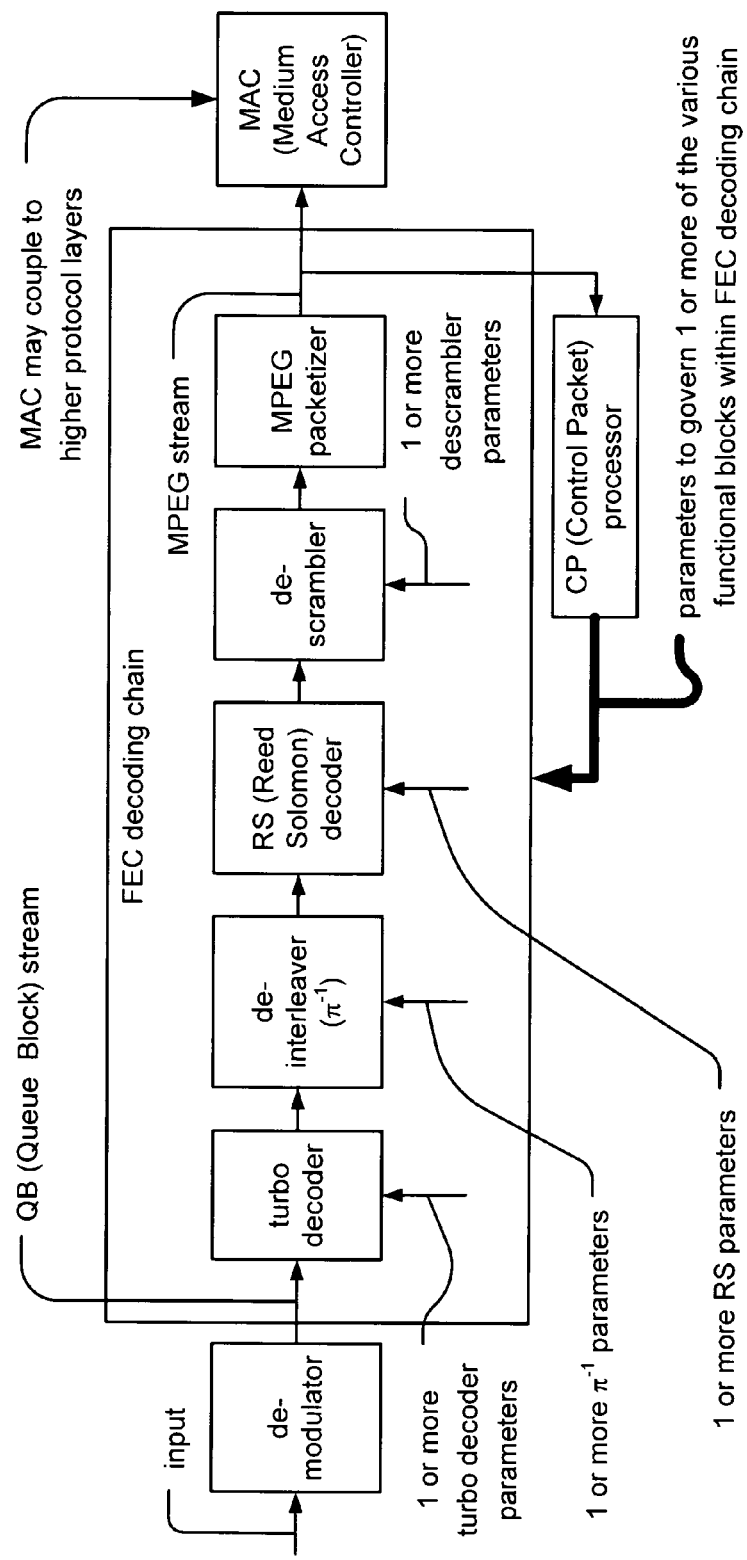
FIG. 13 is a diagram illustrating an embodiment of FEC (Forward Error Correction) decoding chain functionality that may be implemented in accordance with certain aspects of the invention.

FIG. 13 is a diagram illustrating an embodiment of FEC (Forward Error Correction) decoding chain functionality that may be implemented in accordance with certain aspects of the invention. This diagram shows some of the various functional blocks that may be found within an FEC decoding chain (which may alternatively be referred to as an FEC decoder and/or an FEC decoding functional block). An input signal is provided to a demodulator. This input signal that is provided to the demodulator may be viewed as being a signal that is provided from a pre-processing portion of such a communication device that includes the FEC decoding functionality with dynamic parameters as described herein. These various functional blocks within the FEC decoding chain illustrate one possible embodiment of functional blocks that may be employed; however, variations thereof may also employed without departing from the scope and spirit of the invention.

An input signal is provided to a demodulator; this input signal may be viewed as being a digital signal that is generated from a received continuous time signal that has been appropriately filtered, down-converted, digitally sampled, and so on. The demodulator generates a QB (Queue Block) stream that includes a plurality of TBs (Turbo Blocks). Each of the QBs includes a number of TBs. This number of TBs per QB may be selected by a designer of such a device. Various embodiments are also described below indicating some of the possible means by which the QB stream may be viewed in terms of the included TBs.

The QB stream output from the demodulator is passed to an FEC decoding chain functional block. This FEC decoding chain functional block may alternatively be represented as an FEC decoder without departing from the scope and spirit of the invention. The QB stream enters the FEC decoding chain functional block and is initially provided to a turbo decoder that performs iterative decoding processing in an effort to make best estimates of the information bits for each of the symbols (found within the various TBs of the corresponding QBs) included within the received signal on which a communication device including this FEC decoding chain functionality is implemented.

These turbo decoded TBs (of the corresponding QBs of the QB stream) are then passed to a de-interleaver (shown as $\pi^{-1}$). The turbo decoded TBs are then de-interleaved and passed to an RS (Reed Solomon) decoder, which is sometimes referred to as an outer block decoder. After passing through the RS decoder, the signal is passed through a descrambler. The descrambler output is passed to an MPEG packetizer that arranges the signal into an MPEG stream. This MPEG stream may be implemented as an MPEG-2 transport stream in some embodiments. The MPEG stream may be viewed as a successive series of MPEG blocks. The manner by which FEC decoding is to be performed on subsequent MPEG blocks is governed by CP (Control Packet) information that is extracted from a particular type of MPEG block, namely, a CP MPEG block (that includes CP information).

Each of the various functional blocks within the FEC decoding chain functional block includes 1 or more operational parameters (which may be referred to as "FEC decoding parameters" or simply as "parameters" for brevity hereinafter). For example, the turbo decoder operates according to 1 or more turbo decoder parameters; the de-interleaver operates according to 1 or more turbo de-interleaver parameters; the RS decoder operates according to 1 or more RS decoder parameters; and the descrambler operates according to 1 or more descrambler parameters. Some examples of various types of parameters for each of these functional blocks within the FEC decoding chain functional block are described and presented with respect to the following diagram.

The MPEG stream that is generated by the FEC decoding chain functional block is passed to a MAC (Medium Access Controller) and/or other higher protocol layers within the communication device in which the FEC decoding chain functional block is implemented. In addition, this same MPEG stream is also passed to a CP (Control Packet) processor. The CP processor is operable to extract 1 or more parameters from a CP MPEG block (that is within the MPEG stream output from the FEC decoding chain functional block) and to provide those extracted parameters to the appropriate functional blocks within the FEC decoding chain functional block. For example, the extracted parameter may include any 1 or more parameters to adjust the manner by which 1 or more of the functional blocks within the FEC decoding chain functional block operate. This means of extracting the FEC parameters from an actual FEC block (i.e., a CP MPEG block in this particular embodiment) ensures that the FEC parameters that are provided to a receiver end communication device are protected by the FEC. In addition, the same decoding functionality that is operable to operate on the actual MPEG blocks received by such a communication device is also employed to process the CP MPEG blocks that include the FEC parameters. These extracted FEC parameters allow for the adjustment of 1 or more of the parameters that govern the operation of 1 or more of the functional blocks within the FEC decoding chain functional block. This allows for adaptive modulation of the FEC parameters of the FEC decoding chain functional block on the fly (i.e., in real time) in response to changes in the operating conditions of the communication device and/or the communication system in which the communication device is situated and operating.

Figure 14:
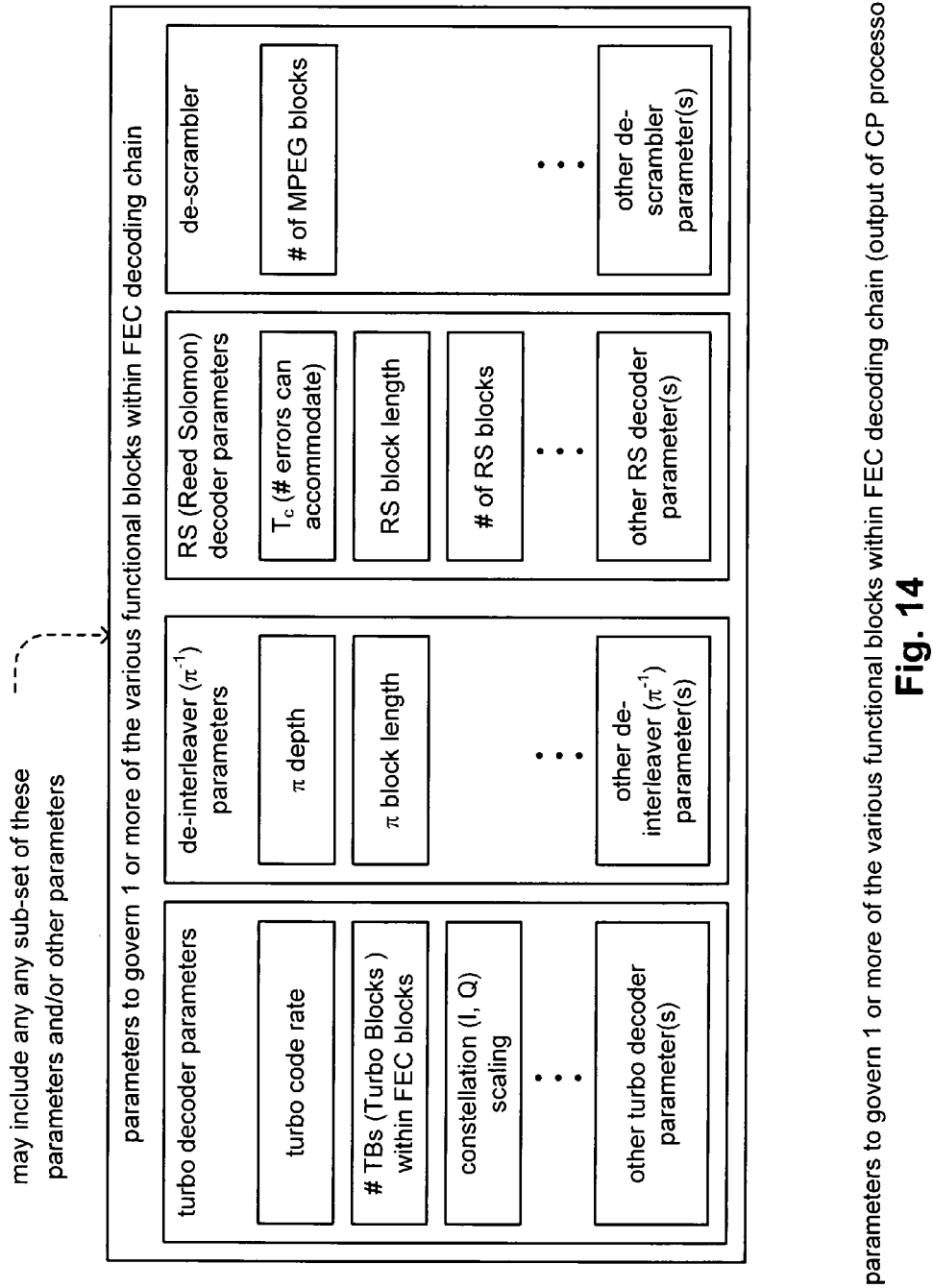
FIG. 14 is a diagram illustrating an embodiment of parameters, which may be output from a CP (Control Packet) processor, to govern 1 or more of the various functional blocks within an FEC decoding in accordance with certain aspects of the invention.

FIG. 14 is a diagram illustrating an embodiment of parameters, which may be output from a CP (Control Packet) processor, to govern 1 or more of the various functional blocks within an FEC decoding in accordance with certain aspects of the invention. This diagram provides a non-exhaustive listing of some of the possible parameters that may be employed to adjust and govern the operation of 1 or more of the functional blocks within the FEC decoding chain functional block.

Looking at the turbo decoder parameters, these parameters may include any number of various parameters by which the turbo code is employed. For example, this may include turbo code rate, the number (#) of TBs (Turbo Blocks) within each of the corresponding FEC blocks, the constellation scaling (i.e., in terms of the I, Q of constellation points within the 2 dimensional I, Q graph of the corresponding constellation shape and modulation type) that is employed, and any other turbo decoder parameter as well. Looking at the de-interleaver ($\pi^{-1}$) parameters, these may include the interleaving depth (shown as $\pi$ depth), interleaving block length (shown as $\pi$ block length), and any other de-interleaver parameter as well. Looking at the RS (Reed Solomon) decoder parameters, these may include $T_c$ (which is known in the RS decoding context as the number of errors that the RS code can accommodate without failing), the RS b block length, the number of RS blocks), and any other RS decoder parameter as well. Looking at the de-scrambler parameters, these may include the number of MPEG blocks that are to be operated on when performing any descrambling operation as well as any other descrambler parameter as well.

Generally speaking, CP MPEG block may include information corresponding to any 1 or more of these parameters depicted within this diagram so that the operation of the various functional blocks within the FEC decoding functional block may be adaptively modified in real time to accommodate any changes in the operating conditions of the communication device in which the FEC decoding functional block is implemented or the communication system in which such a communication device is implemented. Clearly, this list is non-exhaustive, and other user-defined parameters could also be added to (or taken from this list) without departing from the scope and spirit of the invention. Moreover, in particular embodiments whose individual functional blocks within a FEC decoding chain functional block differ from those functional blocks shown in the various embodiments herein, parameters corresponding to those different functional blocks could be added to such a list. Such newly added parameters could also be modified in real time in response to any changes of the operating conditions described above in accordance with the invention.

Figure 15:
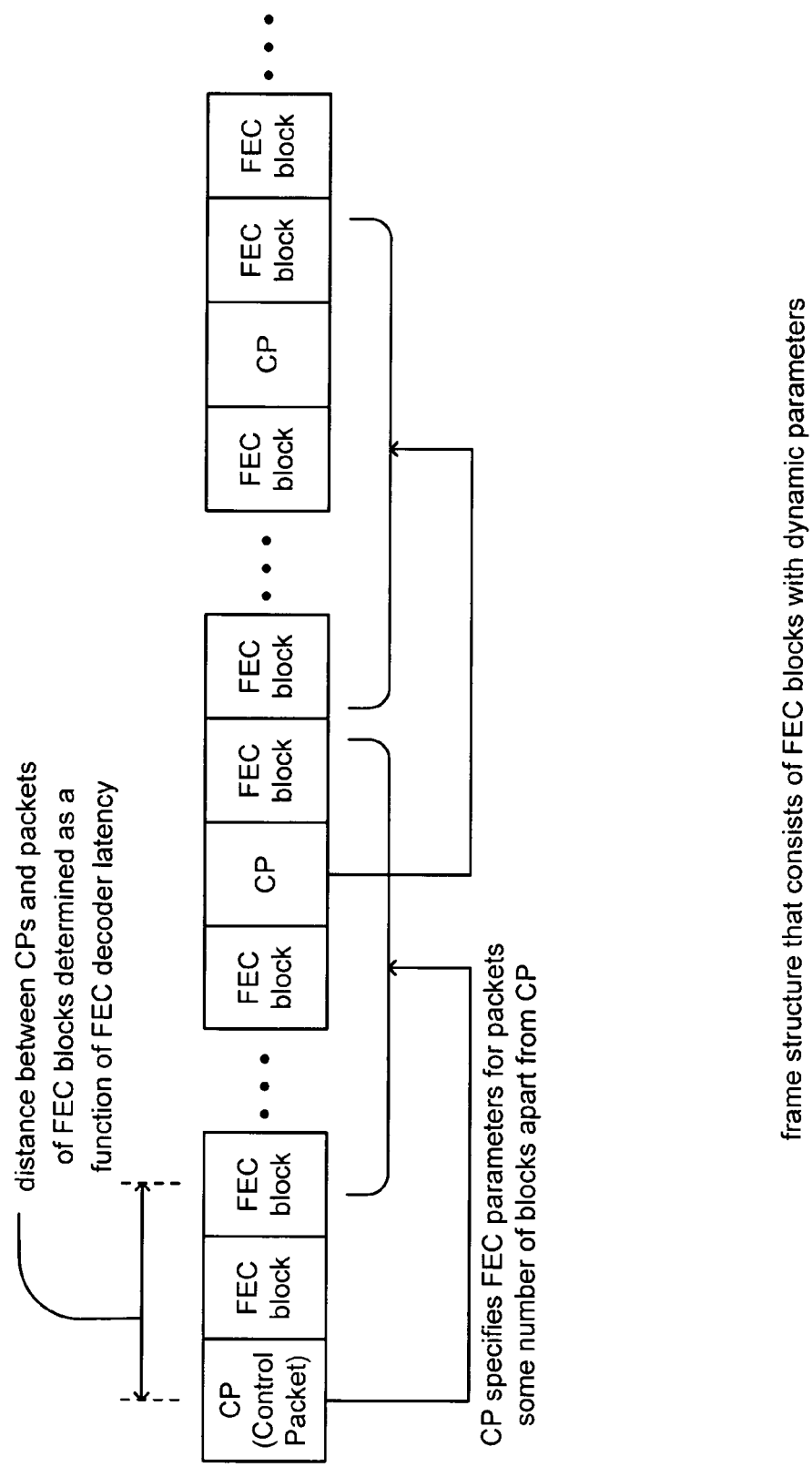
FIG. 15 is a diagram illustrating an embodiment of a frame structure that consists of FEC blocks with dynamic parameters that may be implemented in accordance with certain aspects of the invention.

FIG. 15 is a diagram illustrating an embodiment of a frame structure that consists of FEC blocks with dynamic parameters that may be implemented in accordance with certain aspects of the invention. This diagram shows how a generic CP includes information that is used to specify the FEC decoding parameters for packets (shown as groups of FEC blocks) that are some number of blocks away from the CP. It is noted that the minimum distance (or minimum number) of FEC blocks between the CP and the ISt FEC block for which the parameters of the CP correspond is typically selected based on the intrinsic FEC latency of the FEC decoding functional block. In an ideal situation where an FEC decoding functional block has no latency at all, then the FEC parameters of the CP could very well then apply to govern the FEC decoding of an FEC block immediately following the CP. However, since such an ideal device does not exist, the various operational aspects of the invention provide for a novel means by which the FEC parameters may be passed along with a signal stream, such that they are protected by the very same FEC that is used to protect the information within the signal stream, and such that they may be extracted in a manner for adaptive modification for use in decoding subsequent FEC blocks.

In the embodiment of this diagram, a single FEC block is shown as being between a CP and the FEC blocks whose FEC decoding parameters are specified in that CP. However, more than one FEC block may be interposed between the CP and these FEC blocks specified by that CP without departing from the scope and spirit of the invention as well. In fact, within a particular signal stream, the distance between CPs and the corresponding FEC blocks that are to be decoded using the parameters extracted from those CPs may be variable. For example, the number of FEC blocks between a first CP and those FEC blocks specified by that first CP may be only a singular FEC block. However, the number of FEC blocks between a second CP and those FEC blocks specified by that second CP may be only multiple CPs (e.g., 3 FEC blocks).

Figure 16:
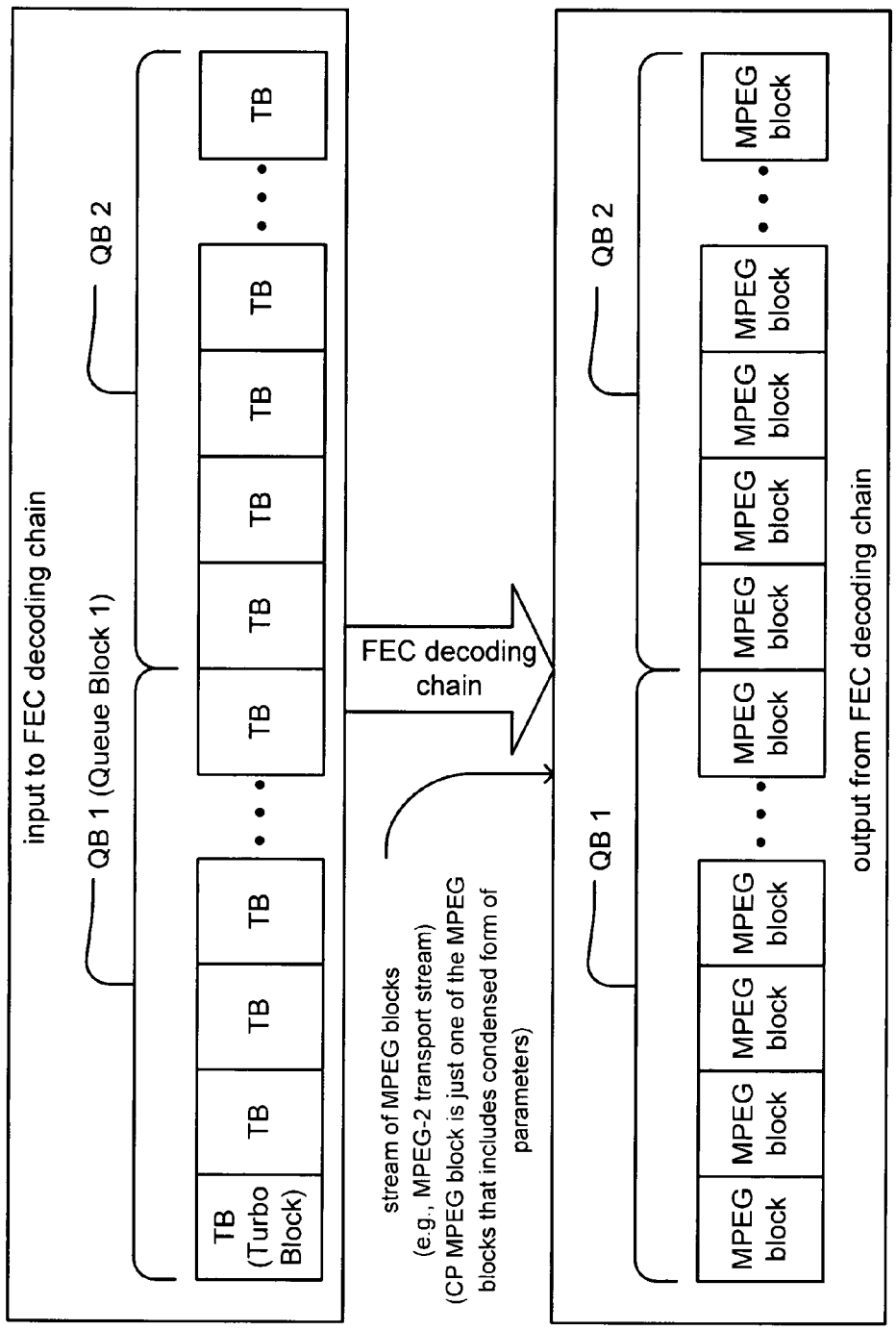
FIG. 16 is a diagram illustrating an embodiment of QB (Queue Block) that may be implemented in accordance with certain aspects of the invention.

FIG. 16 is a diagram illustrating an embodiment of QB (Queue Block) that may be implemented in accordance with certain aspects of the invention. This diagram provide in a bit more detail the relationship between the elements of a QB stream and the types of elements that are included therein during various stages of processing within the FEC decoding chain functional block. The output from a demodulator, communicatively coupled to an FEC decoding functional block, is arranged into a stream of TBs (Turbo Blocks) that compose a number of QBs. More specifically, the QB stream may be viewed as including a number of QBs such that each QB of the QB stream includes a number of TBs. It is also noted that the number of TBs within any given QB is variable. However, the manner in which each of the TBs within a QB is to be processed (e.g., code rate, modulation type, and/or other parameter) is typically the same. Each of the TBs within a given QB is typically processed in a similar manner.

This QB stream (including a plurality of TBs) is provided as the input to the FEC decoding chain functional block where it undergoes processing within each of the various and subsequent functional blocks included therein. For example, the individual TBs of the various QBs of the QB stream may initially undergo turbo decoding, de-interleaving, RS decoding, and subsequently descrambling before being provided to an MPEG packetizer in some embodiments. The output of the FEC decoding chain functional block is a steam of MPEG blocks (i.e., an MPEG stream). This MPEG stream may be implemented as an MPEG-2 transport stream in some instances. It is noted that the alignment of the QBs that are provided to the FEC decoding chain functional block (where the QBs include TBs) is maintained with respect to the output from the FEC decoding chain functional block (where the QBs include MPEG blocks). That is to say, the alignment of the various QBs that are input to the FEC decoding chain functional block is maintained after the processing is completed.

FIG. 17A is a diagram illustrating an embodiment of the relationship between latency and overlap queue that may be existent in accordance with certain aspects of the invention. This diagram shows a situation where a single QB is interposed between a CP and the QBs that are to be decoded according to the parameters contained within that CP. In this diagram, a CP1 includes parameters that are used to govern the decoding of QB1, QB2, ..., QBn, CP2, and QBn+1. It is noted that the CP1 includes parameters that are used to govern the manner by which the CP2 is to be decoded, and from which parameters are to be extracted to govern decoding of subsequent QBs.

It is also noted that the latency of the FEC decoding chain functional block causes the loss of the QBs of the overlap queue. The overlap queue in this embodiment is the QB1 that is immediately after the first CP. It is also noted that the latency of the FEC decoding chain functional block is not strictly a latency associated with the finite amount of time by which the FEC decoding chain functional block operates at a given processing rate (e.g., processing speed or clock rate). This latency that causes the loss of 1 or more QBs of the overlap queue is not fixed. Rather, it is a function of the FEC decoding parameters within the CP itself. For example, if the manner by which a first group of QBs (whose decoding is specified by a first CP) is to be decoded is of a much higher order than the manner by which a second group of QBs (whose decoding is specified by a second CP) is to be decoded, then the time required to decode the first group of QBs will most likely be longer. In that instance, more QBs could potentially be lost given the longer decoding time required.

For example, looking at one simple example, when decoding with respect to a lower order modulation density (e.g., QPSK), the processing requires only calculating a few metrics (e.g., 4 in the QPSK case). However, this is much fewer than when decoding with respect to a higher order modulation density (e.g., 64 QAM), where the processing requires calculating many more metrics (e.g., 64 in the 64 QAM case). Clearly, it may take a longer amount of time to calculate 64 metrics as compared to only 4.

FIG. 17B is a diagram illustrating another embodiment of the relationship between latency and overlap queue that may be existent in accordance with certain aspects of the invention. This diagram shows a situation where multiple QBs (specifically, 3) are interposed between a CP and the QBs that are to be decoded according to the parameters contained within that CP. In this diagram, a CP1 includes parameters that are used to govern the decoding of QB4, ..., QBn, CP2, and QBn+1. It is noted that the CP1 includes parameters that are used to govern the manner by which the CP2 is to be decoded, and from which parameters are to be extracted to govern decoding of subsequent QBs. The overlap queue in this embodiment includes the QB1, the QB2, and the QB 3 that follow after the first CP. It is noted that the number of QBs within an overlap queue can vary within a given QB stream.

FIG. 18A is a diagram illustrating an embodiment of a receiver architecture employing dynamic parameters supported within a frame structure in accordance with certain aspects of the invention. An input signal is first provided to a demodulator that performs any of the necessary demodulation of the received signal to get it into a format that is appropriate for subsequent FEC decoding. Then, the output of the demodulator is provided directly to an FEC decoding chain functional block. In contradistinction to the prior art, the output of the demodulator is not provided also to a parameter extraction functional block. The parameter extraction functional block is instead situated after the FEC decoding functional block in this novel approach.

Again, the CPs specify the FEC decoding parameters for the packets (e.g., FEC blocks) that are some number of blocks apart from them. Before the CP acquisition is performed by the parameter extraction functional block, the FEC decoding chain functional block is configured for the CP format (e.g., in some default format as specified by a user) and all packets are decoded as CP. When the FEC decoding functional block decodes the non-CP packets, the FEC decoding functional block generates errors because the parameters for the non-CP packets are different than those for the CPs.

Only when the FEC decoding functional block receives an actual CP does it generate no error. This is how the FEC decoding functional block can determine that it has in fact received a first CP within the input signal stream. After acquiring the first CP, the FEC decoding functional block has to skip the packets between the CP and the packets that actually specified in that CP. For this purpose, the information on the skipped packets must be also embedded in the CP. Once an incoming stream is acquired, the FEC parameters can then change on the fly (i.e., in real time) based on the parameter information extracted from subsequent CPs. The decoding of the input signal stream is then synchronized as the parameter extraction functional block always then operates to acquire the FEC decoding parameters from the CPs that pertain to the packets that are some number of blocks apart from those respective CPs.

FIG. 18B is a diagram illustrating an embodiment of determination of a CP (Control Packet) MPEG block from among a plurality of MPEG blocks in accordance with certain aspects of the invention. As mentioned with respect to the diagram described just above, only when the FEC decoding functional block receives an actual CP does it generate no error, and this is how the FEC decoding functional block can determine that it has in fact received a first CP within the input signal stream. This diagram shows hardware those TBs that are initially provided to the FEC decoding chain functional block (that are decoded as being expected to be CPs) produce an error (as indicated by the error flag being high. However, when a TB (that is actually a CP) is decoded by the FEC decoding chain functional block, then the error flag will be low thereby indicating that the TB is in fact a CP.

Several of the following diagrams employ CPs that are shown as being CP MPEG blocks for illustration. However, it is also noted that any other type of CPs could be employed in alternative embodiments without departing from the scope and spirit of the invention.

FIG. 19A is a diagram illustrating an embodiment of determination of index usage (shown as Q index) within a CP (Control Packet) MPEG block in accordance with certain aspects of the invention. The use of an index allows for a condensed representation of the parameters within a CP or a CP MPEG block. In this diagram, a Q index is extracted from an CP MPEG block and that Q index is passed through a Q parameter mapping table (e.g., a translation table). The size and number of bits of the Q index is related to the number of parameters that may be specified therein. After the Q index passed through the Q parameter mapping table, the translated parameters are then known and the output of the Q parameter mapping table is shown as being the CP extracted parameters. These extracted parameters may then be employed to adjust the operation of any 1 or more of the functional blocks within an FEC decoding chain functional block.

FIG. 19B is a diagram illustrating an embodiment of possible format of a CP MPEG block that may be employed in accordance with certain aspects of the invention. As mentioned above, the overlap queue is of some concern then beginning to decode a signal stream. This diagram shows how individual QB descriptors are included within a CP MPEG block. The size of this CP MPEG block is shown as being 188 bytes. Clearly, other sizes could also be employed without departing from the scope and spirit of the invention.

The CP MPEG block includes 1 or more headers, and then the various QB descriptors are included. The first 1 or more QB descriptors are overlap QB descriptor(s) that include all of the parameters (e.g., the FEC decoding parameters) that govern the configuration of the individual functional blocks of an FEC decoding chain functional block. The 1 or more overlap QB descriptor(s) also includes information corresponding to the total number (#) of QBs that actually in the overlap queue. As mentioned above, the number of QBs in one overlap queue may differ from the number of QBs in another overlap queue. It is also noted that these 1 or more overlap QB descriptors are only used when detecting a first CP MPEG block within the MPEG stream. They are discarded from subsequent CP MPEG blocks once the system is in synchronization.

After the 1 or more overlap QB descriptor(s) are 1 or more QB descriptor(s). These 1 or more QB descriptor(s) are used to direct the decoding of those QBs that are some distance from the CP MPEG block. That is to say, these 1 or more QB descriptor(s) are used to govern the decoding of the plurality of QBs for which this particular CP MPEG block corresponds. Each of the QB descriptors corresponds to 1 or more QB(s) within the QB stream.

FIG. 19C is a diagram illustrating another embodiment of possible format of a CP MPEG block that may be employed in accordance with certain aspects of the invention. This diagram shows an alternative format of a CP MPEG block. In this embodiment, the CP MPEG block includes no overlap QB descriptors at all. A FEC decoding chain functional block simply skips a predetermined number of QBs before decoding the QBs using the CP extracted parameters. This is a simplified embodiment where a default approach is used to govern the decoding of the FEC decoding chain functional block simply operates according to a predetermined approach (i.e., by skipping a predetermined number of QBs or decoding those predetermined number of QBs according to a predetermined approach before using the CP extracted parameters for decoding of subsequent QBs).

Several of the following diagrams provide possible alternative and embodiments of form that a QB descriptor may have. These QB descriptors may be implemented within either of the two possible embodiments of CP MPEG blocks described above.

FIG. 20 is a diagram illustrating an embodiment of general format of a QB (Queue Block) descriptor (employing 2 bytes) in accordance with certain aspects of the invention. The QB descriptor is partitioned into a plurality of bit fields such that the number of bits within each bit field may be selected by a designer. A repeat field is shown as including a bits (where a is an integer as selected by a designer). An overlap field is shown as including only 1 bit. This 1 bit of the overlap field indicates whether the QB descriptor is an overlap descriptor or a non-overlap descriptor. An opcode field is shown as including c bits (where c is an integer as selected by a designer). The final bit field in this embodiment is a Q index field that is shown as including d bits (where d is an integer as selected by a designer).

The repeat field operates to specify the number of QBs to be repeated and decoded using the parameters extracted from this particular QB descriptor. Generally speaking, the repeat field can be employed to specify up to $2^a$ QBs that are to be repeated. The overlap field specifies whether the QB descriptor is an overlap descriptor or a non-overlap descriptor. The opcode field operates to specify the QB descriptor type that is included within this particular QB descriptor. The Q index field includes the information that is translated using the Q parameter mapping table to determine the particular parameters so that an FEC decoding chain functional block may be appropriately configured to decode the QBs for which this QB descriptor corresponds. It is also noted that additional Q indices may also be employed in alternative embodiments (e.g., within a sequence repeat descriptor, one embodiment of which is described below).

The following 2 diagrams show more specific possible embodiments of how QB descriptors may be implemented in accordance with the invention.

Figure 21:
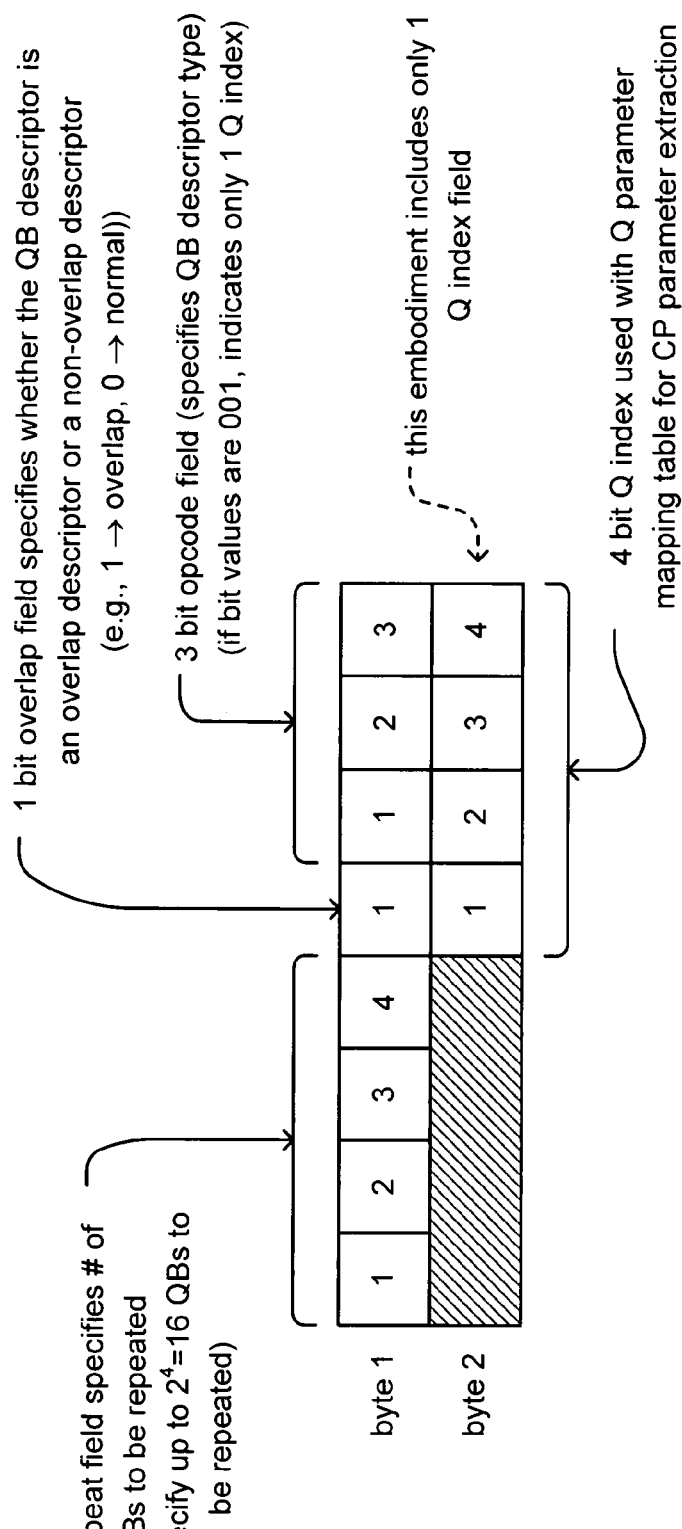
FIG. 21 is a diagram illustrating an embodiment of a format of a QB repeat descriptor (employing 2 bytes), and having 1 Q index, in accordance with certain aspects of the invention.

FIG. 21 is a diagram illustrating an embodiment of a format of a QB repeat descriptor (employing 2 bytes), and having 1 Q index, in accordance with certain aspects of the invention. In this embodiment, a 4 bit repeat field is employed to specify the number of QBs to be repeated and decoded using the parameters extracted from this particular QB descriptor. In this embodiment, up to $2^4=16$ QBs may be specified to be repeated and decoded. A single bit overlap field specifies whether the QB descriptor is an overlap descriptor or a non-overlap descriptor. Specifically, when the single bit of the overlap field is 1, then an overlap queue actually exists. However, when the single bit of the opcode field is 0, then the operation is according to normal operation without dealing with an overlap queue.

A 3 bit opcode field specifies the QB descriptor type. In this embodiment, when the bit values of the opcode field are 001, then it indicates that only 1 Q index is included within this particular QB descriptor. In addition, a 4 bit Q index is used with a Q parameter mapping table for CP parameter extraction from this particular QB descriptor.

Figure 22:
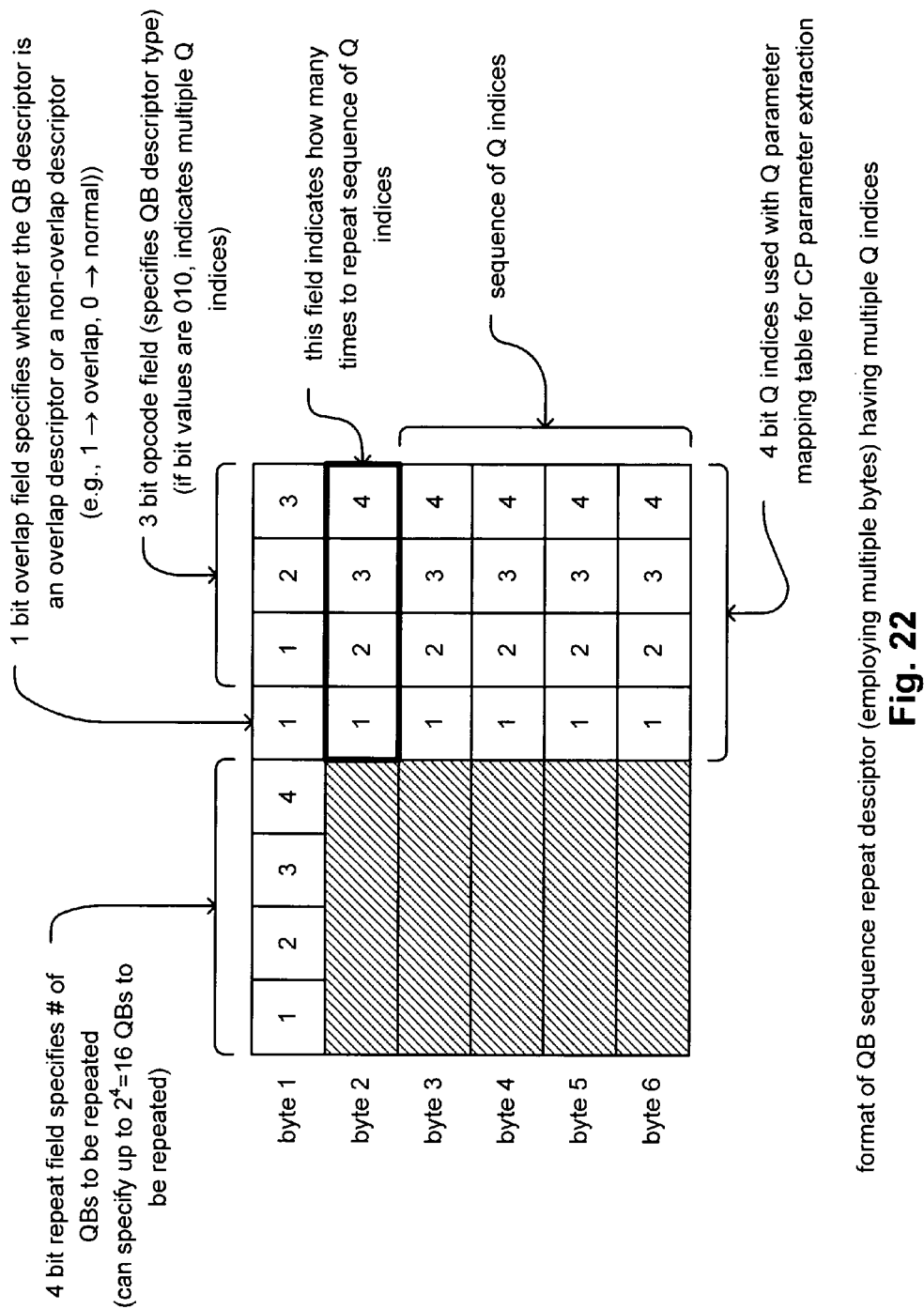
FIG. 22 is a diagram illustrating an embodiment of a format of a QB sequence repeat descriptor (employing multiple bytes), and having multiple Q indices, in accordance with certain aspects of the invention.

FIG. 22 is a diagram illustrating an embodiment of a format of a QB sequence repeat descriptor (employing multiple bytes), and having multiple Q indices, in accordance with certain aspects of the invention. This embodiment is somewhat similar to the embodiment described just above. For example, in this embodiment, a 4 bit repeat field is again employed to specify the number of QBs to be repeated and decoded using the parameters extracted from this particular QB descriptor. In this embodiment, up to $2^4=16$ QBs may be specified to be repeated and decoded. Again, a single bit overlap field specifies whether the QB descriptor is an overlap descriptor or a non-overlap descriptor. Specifically, when the single bit of the overlap field is 1, then an overlap queue actually exists. However, when the single bit of the overlap field is 0, then the operation is according to normal operation without dealing with an overlap queue.

Again, a 3 bit opcode field specifies the QB descriptor type. However, in this embodiment, when the bit values of the opcode field are 010, then it indicates that multiple Q indices are included within this QB descriptor. This also indicates that an additional field is included within the QB descriptor that indicates how many times to repeat the sequence of Q indices to the QBs of the QB stream to which this particular QB descriptor applies. For example, a value of 0010 (binary) =2 in this field would indicate that the sequence of Q indices shown immediately below is to be repeated twice, and a value of 0100 (binary)=4 in this field would indicate that the sequence of Q indices shown immediately below is to be repeated four times. The actual sequence of Q indices is situated below the field indicating the number of times the sequence of Q indices is to be repeated.

Figure 23:
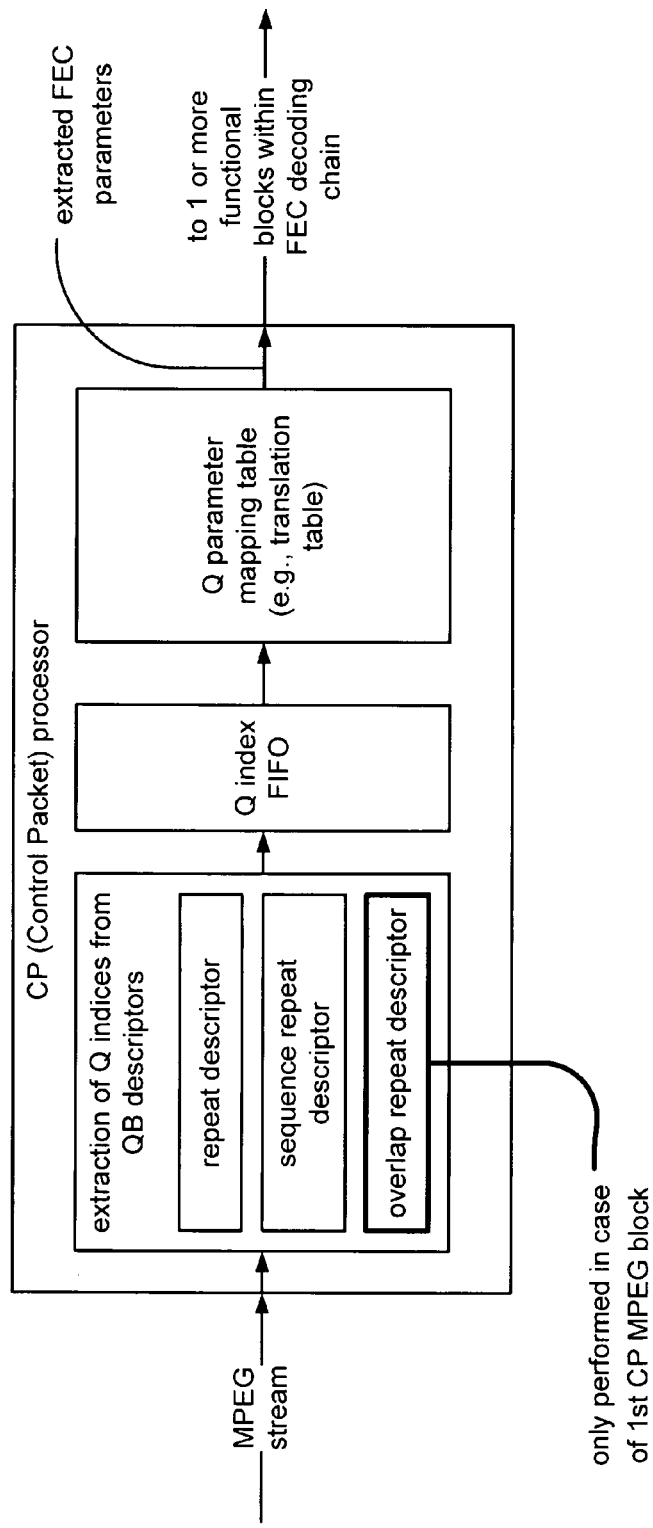
FIG. 23 is a diagram illustrating an embodiment of CP (Control Packet) processor functionality that may be implemented in accordance with certain aspects of the invention.

FIG. 23 is a diagram illustrating an embodiment of CP (Control Packet) processor functionality that may be implemented in accordance with certain aspects of the invention. This diagram shows in perhaps more clear representation that the operation of a CP processor. An MPEG stream is input to the CP processor, and the extraction of the 1 or more Q indices is performed from the QB descriptor of a CP MPEG block. It is noted that if the current CP MPEG block being processed is the first CP MPEG block encountered within the MPEG stream, then the processing may involve the extraction of Q indices from an overlap descriptor, but this is performed only in this instance when the current CP MPEG block being processed is the first CP MPEG block encountered within the MPEG stream. Otherwise, the type of QB descriptors from which the Q indices may be extracted may be of the non-overlap descriptor types.

Once the Q indices have been extracted, then the Q indices are provided into a Q index FIFO (First-In First-Out) buffer. Thereafter, each of the corresponding Q indices are processed through a Q parameter mapping table (e.g., a translation table) where the actual values for the corresponding parameters are determined for use in appropriate configuration of 1 or more of the functional blocks within an FEC decoding chain functional block. After processing a given Q index through the Q parameter mapping table, the now determined and extracted FEC parameters may be use to configure 1 or more of the functional blocks within an FEC decoding chain functional block.

The operation of the CP processor may be viewed as performing and supporting the functionality of parameter extraction from a CP MPEG block. The operation of the CP processor may also be initiated upon the detection of a CP MPEG block from among a plurality of MPEG blocks within an MPEG stream. That is to say, the CP processor need not be operating in an attempt to extract parameters from each and every MPEG block of an MPEG stream. Rather, the CP processor can be directed to operate to extract the parameters from the current MPEG block only when the current MPEG block has been determined to be a CP MPEG block.

Figure 24:
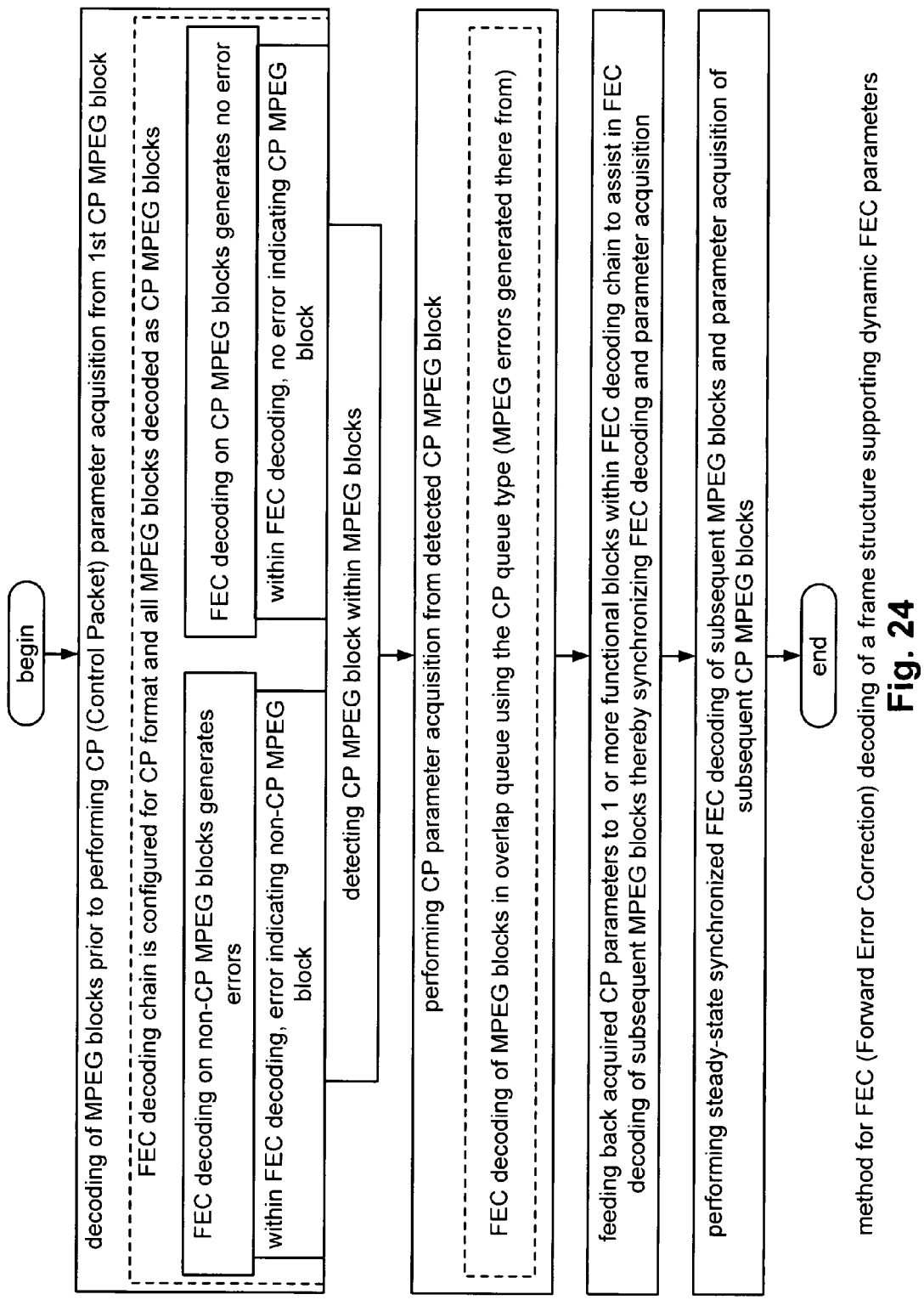
FIG. 24 is a flowchart illustrating an embodiment of a method for FEC (Forward Error Correction) decoding of a frame structure supporting dynamic FEC parameters that may be performed in accordance with certain aspects of the invention.

FIG. 24 is a flowchart illustrating an embodiment of a method for FEC (Forward Error Correction) decoding of a frame structure supporting dynamic FEC parameters that may be performed in accordance with certain aspects of the invention.

The method involves decoding of MPEG blocks (i.e., of an MPEG stream) prior to performing CP (Control Packet) parameter acquisition from a first CP MPEG block within the MPEG stream. In doing this decoding approach, prior to performing CP parameter acquisition, the FEC decoding chain is configured for a predetermined CP format and all of the MPEG blocks to be decoded as CP MPEG blocks. Accordingly, the FEC decoding that is performed on non-CP MPEG blocks generates errors (which may be used to indicate a non-CP MPEG block), and the FEC decoding that is performed on CP MPEG blocks generates no error (which may be used to indicate a CP MPEG block).

Once an MPEG block undergoes FEC decoding using the FEC decoding chain functional block as having no error, the method involves detecting a CP MPEG block within the input signal stream (e.g., from among a plurality of MPEG blocks). Once this CP MPEG block has been appropriately identified, then the method involves performing CP parameter acquisition from the detected CP MPEG block.

It is also noted that the method involves FEC decoding of the MPEG blocks immediately after CP; the FEC decoding of the MPEG blocks in the overlap queue is performed using the CP queue type. Because of this, MPEG errors generated there from. The overlap descriptors and extracted parameters operate to provide for synchronization within the decoding processing. This provides information corresponding to how many turbo code blocks the CP queue has, and information corresponding to how many turbo blocks the whole overlap part has may be extracted. By having these two pieces of information, it may be determined where to begin decoding using the actual FEC parameters extracted from non-overlap descriptors. This determination of where to begin decoding using the actually extracted FEC parameters may be viewed as a "boot-strapping" situation that must only be dealt with once until the system is synchronized.

Once these FEC decoding parameters have been extracted from the CP packet, the method involves feeding back the acquired CP parameters to 1 or more of the functional blocks within the FEC decoding chain functional block to assist in decoding of the subsequent MPEG blocks thereby synchronizing the FEC decoding and the parameter acquisition of the MPEG stream. The method then continues by performing steady-state synchronized FEC decoding of subsequent MPEG blocks and by performing parameter acquisition of subsequent CP MPEG blocks of the input signal stream. In steady-state operation, although there is some degree of latency in the FEC decoding, none of the queues are wasted in steady-state operation because the FEC decoding parameters for the overlap queues are specified in the previous CP.

Figure 25:
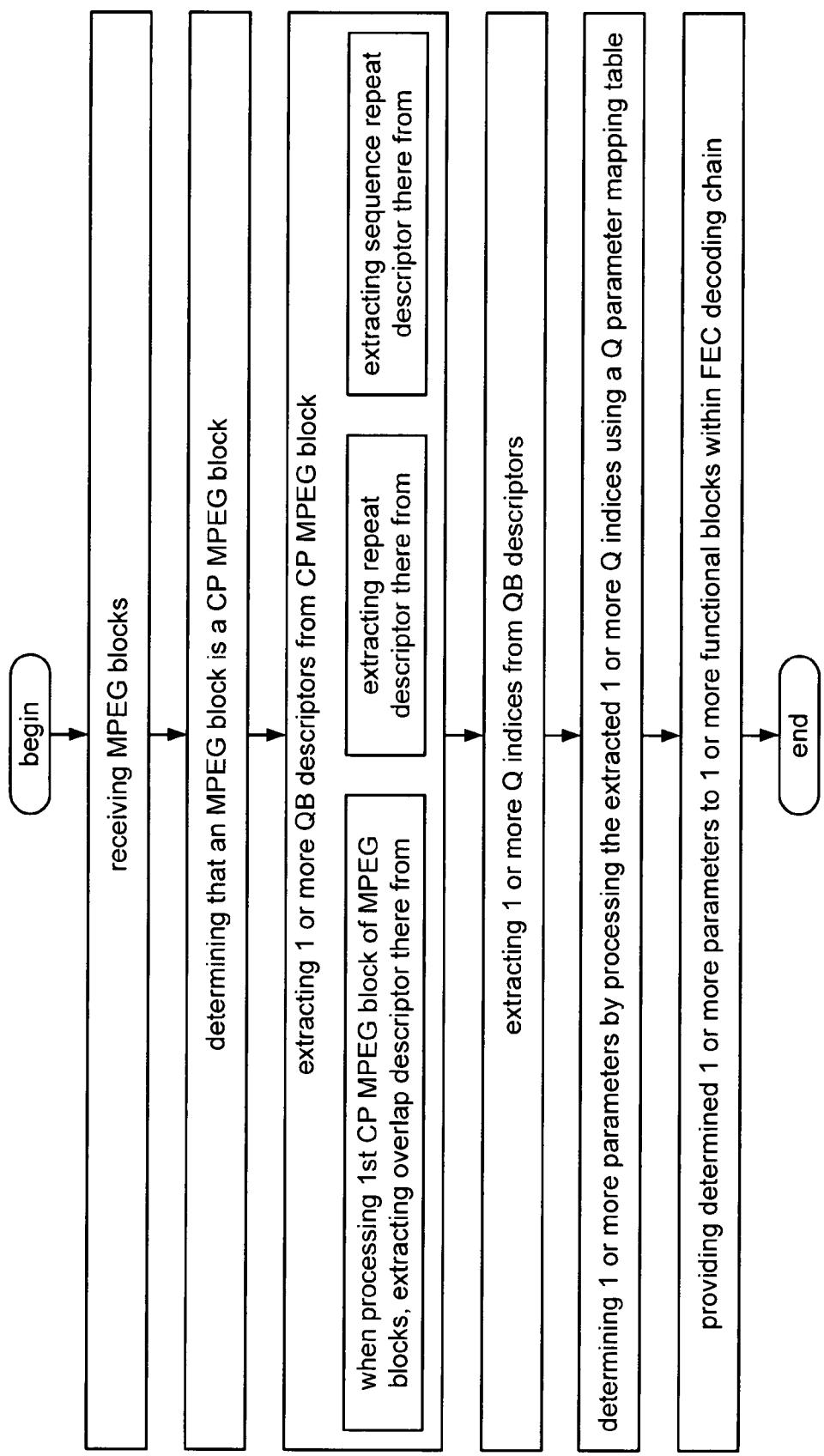
FIG. 25 is a flowchart illustrating an embodiment of a method for CP (Control Packet) processing that may be performed in accordance with certain aspects of the invention.

FIG. 25 is a flowchart illustrating an embodiment of a method for CP (Control Packet) processing that may be performed in accordance with certain aspects of the invention. The method initially involves receiving a plurality of MPEG blocks. These MPEG blocks may be viewed as being an MPEG stream in some situations. The method then involves determining that an MPEG block (of the plurality of MPEG blocks) is in fact a CP MPEG block. The method then operates by extracting 1 or more QB descriptors from the determined CP MPEG block. When processing a first CP MPEG block of the MPEG blocks, the method may be performed to involve extracting an overlap descriptor there from. The method may also alternatively involve extracting a repeat descriptor from the CP MPEG block or extracting a sequence repeat descriptor from the CP MPEG block.

When processing the descriptors (i.e., the QB descriptors) from the CP MPEG block, the method involves extracting 1 or more Q indices from the QB descriptors. Once the 1 or more Q indices have been extracted, the method involves determining 1 or more parameters by processing the extracted 1 or more Q indices using a Q parameter mapping table. Afterwards, the method involves providing the determined 1 or more parameters to 1 or more functional blocks within an FEC decoding chain.

FIG. 26 is a flowchart illustrating an embodiment of a method for adaptively changing frame structure and frame content based on operating conditions in accordance with certain aspects of the invention. The method involves transmitting a first signal downstream according to a first frame structure and a first frame content. Then, the method involves receiving the first signal, and determining 1 or more indicia corresponding to the operating conditions there from. An example piece of information that is indicative of the operating conditions is SNR (Signal to Noise Ratio). However, other indicia of operating conditions could also be employed without departing from the scope and spirit of the invention.

The method then involves providing the 1 or more indicia corresponding to the operating conditions upstream (for use in subsequent transmitting). The method then involves transmitting a second signal downstream according to a second frame structure and a second frame content. This second frame structure and a second frame content may be selected based on the 1 or more indicia corresponding to operating conditions of a communication system. This method provides a means by which adaptive modification of the frame structure and frame content employed within a communication system may be modified. The various approaches provided herein provide a means by which parameters that govern FEC decoding may be very effectively and efficiently modified in response to any changes in operating condition.

A very simplistic example is provided below by which this method may be performed. Three different possible queue types are considered in this very simplistic example.

Queue type A: 1/2 QPSK
Queue type B: 2/3 8 PSK
Queue type C: 16 QAM 1 or more subscriber modem(s) can report indicia corresponding to the operating conditions (e.g., their SNR) to the headend using an upstream channel. When all of the subscriber modem(s) are in a poor operating condition (e.g., poor SNR condition), the headend sends downstream signal only using queue type A. When the operating condition (e.g., SNR) in some subscribers improves, it starts using queue type B. When the SNR condition improves more, it starts using queue type C. Also, it can change the number of QBs with each queue type adaptively. Generally speaking, the headend chooses the appropriate queue types from among a pre-determined set of queue types and then builds downstream frames based on the subscriber's operating condition (e.g., SNR).

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

Moreover, it is noted that the receiver architecture, methods, and other functionality presented herein can operate at a much lower SNR, when compared to prior art approaches, thanks to the FEC correction capability for the CPs provided herein. The ability to protect the CPs using FEC allows for a much improved performance when compared to the prior art.

In view of the above detailed description of the invention and associated drawings, other modifications and variations will now become apparent. It should also be apparent that such other modifications and variations may be effected without departing from the spirit and scope of the invention.

What is claimed is:
1. A communication device, comprising:
  a demodulator to process a signal thereby generating a plurality of blocks that includes a first block followed by a second block followed by a third block;
  a decoder to:
    decode the first block using a first decoding parameter; and
    detect a second decoding parameter in the first block; and
  a parameter extraction module to extract the second decoding parameter from the first block; and wherein:
    the decoder is to decode the second block using at least one additional decoding parameter extracted from at least one block preceding the first block;

the decoder is to decode the third block using the second decoding parameter.

2. The communication device of claim 1, wherein:
the first block is a CP (Control Packet);
the second block is a first FEC (Forward Error Correction) block; and
the third block is a second FEC block.

3. The communication device of claim 1, wherein:
when the decoder decodes the first block, the decoder is operable to indicate no error to the parameter extraction module thereby indicating that the first block is a CP (Control Packet); and
when the decoder decodes the second block, the decoder is operable to indicate an error to the parameter extraction module thereby indicating that the second block is an FEC (Forward Error Correction) block.

4. The communication device of claim 1, wherein:
at least one additional block that is interposed between the second block and the third block.

5. The communication device of claim 1, wherein:
at least one of the first decoding parameter and the second decoding parameter is a code rate, a constellation scaling parameter, a de-interleaver parameter, a RS (Reed-Solomon) block length, or a number of MPEG (Moving Picture Experts Group) blocks within the plurality of blocks.

6. The communication device of claim 1, wherein:
the plurality of blocks that is provided to the decoder is a plurality of TBs (Turbo Blocks); and
the decoder is operable to decode the plurality of TBs thereby generating a plurality of MPEG (Moving Picture Experts Group) blocks.

7. The communication device of claim 1, wherein:
the parameter extraction module is operable to extract a plurality of decoding parameters that includes the second decoding parameter from the first block; and
the decoder includes a plurality of modules such that each module is governed by at least one decoding parameter within the plurality of decoding parameters.

8. The communication device of claim 1, further comprising:
a medium access controller (MAC) that is coupled to receive output from the decoder.

9. The communication device of claim 1, wherein:
the second decoding parameter is processed using a translation table thereby identifying a plurality of decoding parameters; and
the decoder includes a plurality of modules such that each module is governed by at least one decoding parameter within the plurality of decoding parameters.

10. The communication device of claim 1, wherein:
the communication device is implemented within at least one of a one-way satellite communication system, a two-way satellite communication system, and an HDTV (High Definition Television) communication system.

11. A communication device, comprising:
a demodulator to process a signal thereby generating a plurality of blocks that includes at least one FEC (Forward Error Correction) block and at least one CP (Control Packet);
a decoder to:
decode a first subset of the plurality of blocks using a first plurality of decoding parameters; and
detect the at least one CP within the plurality of blocks based on an error flag associated with the at least one CP indicating different parameters therein relative to the at least one FEC block; and a parameter extraction module that, based upon the detection of the at least one CP by the decoder, extracts a second plurality of decoding parameters from the at least one CP; and wherein:
the decoder decodes a second subset of the plurality of blocks using the second plurality of decoding parameters.

12. The communication device of claim 11, wherein:
at least one FEC block is interposed between the first subset of the plurality of blocks and the second subset of the plurality of blocks;
the first subset of the plurality of blocks includes only the at least one CP; and
the second subset of the plurality of blocks is a plurality of FEC blocks.

13. The communication device of claim 11, wherein:
the at least one CP includes an overlap descriptor that indicates a number of FEC blocks that are interposed between the first subset of the plurality of blocks and the second subset of the plurality of blocks.

14. The communication device of claim 11, wherein:
the parameter extraction module, based upon the detection of the at least one CP by the decoder, is operable to extract an index from the at least one CP;
the parameter extraction module is operable to process the index using a translation table to extract the second plurality of decoding parameters from the at least one CP; and
the decoder includes a plurality of modules such that each module is governed by at least one decoding parameter within the second plurality of decoding parameters.

15. The communication device of claim 11, wherein:
the communication device is implemented within at least one of a one-way satellite communication system, a two-way satellite communication system, and an HDTV (High Definition Television) communication system.

16. A method for decoding a signal, the method comprising:
processing a signal thereby generating a plurality of blocks that includes a first block followed by a second block followed by a third block;
decoding the first block using a first decoding parameter;
detecting a second decoding parameter in the first block;
extracting the second decoding parameter from the first block;
decoding the second block using at least one additional decoding parameter extracted from at least one block preceding the first block; and
decoding the third block using the second decoding parameter.

17. The method of claim 16, wherein:
the first block is a CP (Control Packet);
the second block is a first FEC (Forward Error Correction) block; and
the third block is a second FEC block.

18. The method of claim 16, wherein:
at least one of the first decoding parameter and the second decoding parameter is a code rate, a constellation scaling parameter, a de-interleaver parameter, a RS (Reed-Solomon) block length, or a number of MPEG (Moving Picture Experts Group) blocks within the plurality of blocks.

19. The method of claim 16, further comprising:
processing the second decoding parameter using a translation table thereby identifying a plurality of decoding parameters; and employing a plurality of decoding modules to decode the third block such that each module is governed by at least one decoding parameter within the plurality of decoding parameters.

20. The method of claim 16, wherein:

the method is performed within a communication device; and the communication device is implemented within at least one of a one-way satellite communication system, a two-way satellite communication system, and an HDTV (High Definition Television) communication system.

* * * * *